(12) United States Patent
Fukuyo et al.

(10) Patent No.: US 8,598,015 B2
(45) Date of Patent: Dec. 3, 2013

(54) LASER PROCESSING METHOD

(75) Inventors: Fumitsugu Fukuyo, Hamamatsu (JP); Kenshi Fukumitsu, Hamamatsu (JP)

(73) Assignee: Hamamatsu Photonics K.K., Hamanatsu-shi, Shizuoka (JP)

( * ) Notice: Subject to any disclaimer, the term of this patent is extended or adjusted under 35 U.S.C. 154(b) by 0 days.

(21) Appl. No.: 13/614,042

(22) Filed: Sep. 13, 2012

(65) Prior Publication Data
US 2013/0252402 A1    Sep. 26, 2013

Related U.S. Application Data

(62) Division of application No. 10/507,392, filed as application No. PCT/JP03/02945 on Mar. 12, 2003, now Pat. No. 8,361,883.

(30) Foreign Application Priority Data

Mar. 12, 2002  (JP) .............................. P2002-067372

(51) Int. Cl.
    *H01L 21/00*    (2006.01)
(52) U.S. Cl.
    USPC ..... 438/460; 438/463; 438/465; 257/E21.237
(58) Field of Classification Search
    USPC .................. 438/460, 463, 465; 257/E21.237
    See application file for complete search history.

(56) References Cited

U.S. PATENT DOCUMENTS

| 3,448,510 A | 6/1969 | Bippus et al. |
| 3,543,979 A | 12/1970 | Grove et al. |
| 3,610,871 A | 10/1971 | Lumley |
| 3,613,974 A | 10/1971 | Chatelain et al. |
| 3,626,141 A | 12/1971 | Daly |
| 3,629,545 A | 12/1971 | Graham et al. |
| 3,790,051 A | 2/1974 | Moore |
| 3,790,744 A | 2/1974 | Bowen |
| 3,824,678 A | 7/1974 | Harris et al. |
| 3,909,582 A | 9/1975 | Bowen |
| 3,970,819 A | 7/1976 | Gates et al. |
| 4,092,518 A | 5/1978 | Merard |

(Continued)

FOREIGN PATENT DOCUMENTS

| CN | 1160228 A | 9/1997 |
| DE | 196 46 332 A1 | 5/1998 |

(Continued)

OTHER PUBLICATIONS

Search Report, Oct. 8, 2012, Intellectual Property Office of Singapore.

(Continued)

*Primary Examiner* — Eugene Lee
*Assistant Examiner* — Elias M Ullah
(74) *Attorney, Agent, or Firm* — Drinker Biddle & Reath LLP

(57) ABSTRACT

A laser processing method which can highly accurately cut objects to be processed having various laminate structures is provided. An object to be processed comprising a substrate and a laminate part disposed on the front face of the substrate is irradiated with laser light L while a light-converging point P is positioned at least within the substrate, so as to form a modified region due to multiphoton absorption at least within the substrate, and cause the modified region to form a starting point region for cutting. When the object is cut along the starting point region for cutting, the object 1 can be cut with a high accuracy.

18 Claims, 17 Drawing Sheets

(56) References Cited

U.S. PATENT DOCUMENTS

| | | |
|---|---|---|
| 4,242,152 A | 12/1980 | Stone |
| 4,306,351 A | 12/1981 | Ohsaka et al. |
| 4,336,439 A | 6/1982 | Sasnett et al. |
| 4,475,027 A | 10/1984 | Pressley |
| 4,531,060 A | 7/1985 | Suwa et al. |
| 4,546,231 A | 10/1985 | Gresser et al. |
| 4,562,333 A | 12/1985 | Taub et al. |
| 4,650,619 A | 3/1987 | Watanabe |
| 4,682,003 A | 7/1987 | Minakawa et al. |
| 4,689,467 A | 8/1987 | Inoue |
| 4,691,093 A | 9/1987 | Banas et al. |
| 4,734,550 A | 3/1988 | Imamura et al. |
| 4,769,310 A | 9/1988 | Gugger et al. |
| 4,814,575 A | 3/1989 | Petitbon |
| 4,815,854 A | 3/1989 | Tanaka et al. |
| 4,899,126 A | 2/1990 | Yamada |
| 4,914,815 A | 4/1990 | Takada et al. |
| 4,981,525 A | 1/1991 | Kiyama et al. |
| 5,096,449 A | 3/1992 | Matsuzaki |
| 5,132,505 A | 7/1992 | Zonneveld et al. |
| 5,211,805 A | 5/1993 | Srinivasan |
| 5,230,184 A | 7/1993 | Bukhman |
| 5,251,003 A | 10/1993 | Vigouroux et al. |
| 5,254,149 A | 10/1993 | Hashemi et al. |
| 5,254,833 A | 10/1993 | Okiyama |
| 5,304,357 A | 4/1994 | Sato et al. |
| 5,376,793 A | 12/1994 | Lesniak |
| 5,382,770 A | 1/1995 | Black et al. |
| 5,534,102 A | 7/1996 | Kadono et al. |
| 5,543,365 A | 8/1996 | Wills et al. |
| 5,575,936 A | 11/1996 | Goldfarb |
| 5,580,473 A | 12/1996 | Shinohara et al. |
| 5,609,284 A | 3/1997 | Kondratenko |
| 5,622,540 A | 4/1997 | Stevens |
| 5,637,244 A | 6/1997 | Erokhin |
| 5,641,416 A | 6/1997 | Chadha |
| 5,656,186 A | 8/1997 | Mourou et al. |
| 5,762,744 A | 6/1998 | Shibata et al. |
| 5,767,483 A | 6/1998 | Cameron et al. |
| 5,776,220 A | 7/1998 | Allaire et al. |
| 5,786,560 A | 7/1998 | Tatah et al. |
| 5,795,795 A | 8/1998 | Kousai et al. |
| 5,814,532 A | 9/1998 | Ichihara |
| 5,826,772 A | 10/1998 | Ariglio et al. |
| 5,841,543 A | 11/1998 | Guldi et al. |
| 5,882,956 A | 3/1999 | Umehara et al. |
| 5,886,319 A | 3/1999 | Preston et al. |
| 5,900,582 A | 5/1999 | Tomita et al. |
| 5,916,460 A | 6/1999 | Imoto et al. |
| 5,925,271 A | 7/1999 | Pollack et al. |
| 5,968,382 A | 10/1999 | Matsumoto et al. |
| 5,976,392 A | 11/1999 | Chen |
| 5,998,238 A | 12/1999 | Kosaki |
| 6,023,039 A | 2/2000 | Sawada |
| 6,031,201 A | 2/2000 | Amako et al. |
| 6,055,829 A | 5/2000 | Witzmann et al. |
| 6,057,525 A | 5/2000 | Chang et al. |
| 6,121,118 A | 9/2000 | Jin et al. |
| 6,127,005 A | 10/2000 | Lehman et al. |
| 6,156,030 A | 12/2000 | Neev |
| 6,172,329 B1 | 1/2001 | Shoemaker et al. |
| 6,175,096 B1 | 1/2001 | Nielsen |
| 6,181,728 B1 | 1/2001 | Cordingley et al. |
| 6,187,088 B1 | 2/2001 | Okumura |
| 6,211,488 B1 | 4/2001 | Hoekstra et al. |
| 6,229,113 B1 | 5/2001 | Brown |
| 6,229,114 B1 | 5/2001 | Andrews et al. |
| 6,236,446 B1 | 5/2001 | Izumi et al. |
| 6,252,197 B1 | 6/2001 | Hoekstra et al. |
| 6,257,224 B1 | 7/2001 | Yoshino et al. |
| 6,259,058 B1 | 7/2001 | Hoekstra |
| 6,285,002 B1 | 9/2001 | Ngoi et al. |
| 6,294,439 B1 | 9/2001 | Sasaki et al. |
| 6,322,958 B1 | 11/2001 | Hayashi |
| 6,325,855 B1 | 12/2001 | Sillmon et al. |
| 6,333,486 B1 | 12/2001 | Troitski |
| 6,344,402 B1 | 2/2002 | Sekiya |
| 6,359,254 B1 | 3/2002 | Brown |
| 6,376,797 B1 | 4/2002 | Piwczyk et al. |
| 6,402,004 B1 | 6/2002 | Yoshikuni et al. |
| 6,407,363 B2 | 6/2002 | Dunsky et al. |
| 6,420,678 B1 | 7/2002 | Hoekstra |
| 6,438,996 B1 | 8/2002 | Cuvelier |
| 6,489,588 B1 | 12/2002 | Hoekstra et al. |
| 6,562,698 B2 | 5/2003 | Manor |
| 6,566,683 B1 | 5/2003 | Ogawa et al. |
| 6,653,210 B2 | 11/2003 | Choo et al. |
| 6,726,631 B2 | 4/2004 | Hatangadi et al. |
| 6,744,009 B1 | 6/2004 | Xuan et al. |
| 6,770,544 B2 | 8/2004 | Sawada |
| 6,787,732 B1 | 9/2004 | Xuan et al. |
| 6,908,784 B1 | 6/2005 | Farnworth et al. |
| 6,951,799 B2 | 10/2005 | Roche |
| 6,992,026 B2 | 1/2006 | Fukuyo et al. |
| 7,174,620 B2 | 2/2007 | Chiba et al. |
| 7,396,742 B2 | 7/2008 | Fukuyo et al. |
| 7,489,454 B2 | 2/2009 | Fukuyo et al. |
| 7,547,613 B2 | 6/2009 | Fukuyo et al. |
| 7,566,635 B2 | 7/2009 | Fujii et al. |
| 7,592,237 B2 | 9/2009 | Sakamoto et al. |
| 7,592,238 B2 | 9/2009 | Fukuyo et al. |
| 7,605,344 B2 | 10/2009 | Fukumitsu |
| 7,608,214 B2 | 10/2009 | Kuno et al. |
| 7,615,721 B2 | 11/2009 | Fukuyo et al. |
| 7,626,137 B2 | 12/2009 | Fukuyo et al. |
| 7,709,767 B2 | 5/2010 | Sakamoto |
| 7,718,510 B2 | 5/2010 | Sakamoto et al. |
| 7,719,017 B2 | 5/2010 | Tanaka |
| 7,732,730 B2 | 6/2010 | Fukuyo et al. |
| 7,749,867 B2 | 7/2010 | Fukuyo et al. |
| 7,754,583 B2 | 7/2010 | Sakamoto |
| 7,825,350 B2 | 11/2010 | Fukuyo et al. |
| 7,897,487 B2 | 3/2011 | Sugiura et al. |
| 7,902,636 B2 | 3/2011 | Sugiura et al. |
| 7,939,430 B2 | 5/2011 | Sakamoto et al. |
| 7,947,574 B2 | 5/2011 | Sakamoto et al. |
| 2001/0029673 A1 | 10/2001 | Brown et al. |
| 2001/0035401 A1 | 11/2001 | Manor |
| 2001/0046112 A1 | 11/2001 | Herchen |
| 2002/0006765 A1 | 1/2002 | Michel et al. |
| 2002/0025432 A1 | 2/2002 | Noguchi et al. |
| 2002/0096994 A1 | 7/2002 | Iwafuchi et al. |
| 2002/0115235 A1 | 8/2002 | Sawada |
| 2002/0158288 A1 | 10/2002 | Yamazaki et al. |
| 2002/0170896 A1 | 11/2002 | Choo et al. |
| 2002/0177288 A1 | 11/2002 | Brown et al. |
| 2003/0010275 A1 | 1/2003 | Radojevic et al. |
| 2003/0024909 A1 | 2/2003 | Hoekstra et al. |
| 2003/0141570 A1 | 7/2003 | Chen et al. |
| 2004/0002199 A1 | 1/2004 | Fukuyo et al. |
| 2004/0245659 A1 | 12/2004 | Glenn et al. |
| 2005/0173387 A1 | 8/2005 | Fukuyo et al. |
| 2005/0181581 A1 | 8/2005 | Fukuyo et al. |
| 2005/0184037 A1 | 8/2005 | Fukuyo et al. |
| 2005/0189330 A1 | 9/2005 | Fukuyo et al. |
| 2005/0194364 A1 | 9/2005 | Fukuyo et al. |
| 2005/0272223 A1 | 12/2005 | Fujii et al. |
| 2005/0282359 A1 | 12/2005 | Nagai et al. |
| 2006/0011593 A1 | 1/2006 | Fukuyo et al. |
| 2006/0040473 A1 | 2/2006 | Fukuyo et al. |
| 2006/0121697 A1 | 6/2006 | Fujii et al. |
| 2006/0144828 A1 | 7/2006 | Fukumitsu et al. |
| 2006/0148212 A1 | 7/2006 | Fukuyo et al. |
| 2006/0160331 A1 | 7/2006 | Fukuyo et al. |
| 2006/0255024 A1 | 11/2006 | Fukuyo et al. |
| 2007/0085099 A1 | 4/2007 | Fukumitsu et al. |
| 2007/0125757 A1 | 6/2007 | Fukuyo et al. |
| 2007/0158314 A1 | 7/2007 | Fukumitsu et al. |
| 2007/0252154 A1 | 11/2007 | Uchiyama et al. |
| 2008/0035611 A1 | 2/2008 | Kuno et al. |
| 2008/0037003 A1 | 2/2008 | Atsumi et al. |
| 2008/0090382 A1 | 4/2008 | Fujii et al. |
| 2008/0218735 A1 | 9/2008 | Atsumi et al. |
| 2008/0251506 A1 | 10/2008 | Atsumi et al. |

(56) References Cited

U.S. PATENT DOCUMENTS

| | | |
|---|---|---|
| 2009/0008373 A1 | 1/2009 | Muramatsu et al. |
| 2009/0032509 A1 | 2/2009 | Kuno et al. |
| 2009/0098713 A1 | 4/2009 | Sakamoto |
| 2009/0107967 A1 | 4/2009 | Sakamoto et al. |
| 2009/0117712 A1 | 5/2009 | Sakamoto et al. |
| 2009/0166342 A1 | 7/2009 | Kuno et al. |
| 2009/0166808 A1 | 7/2009 | Sakamoto et al. |
| 2009/0250446 A1 | 10/2009 | Sakamoto |
| 2009/0261083 A1 | 10/2009 | Osajima et al. |
| 2009/0302428 A1 | 12/2009 | Sakamoto et al. |
| 2010/0006548 A1 | 1/2010 | Atsumi et al. |
| 2010/0009547 A1 | 1/2010 | Sakamoto |
| 2010/0012632 A1 | 1/2010 | Sakamoto |
| 2010/0012633 A1 | 1/2010 | Atsumi et al. |
| 2010/0015783 A1 | 1/2010 | Fukuyo et al. |
| 2010/0025386 A1 | 2/2010 | Kuno et al. |
| 2010/0032418 A1 | 2/2010 | Kuno et al. |
| 2010/0055876 A1 | 3/2010 | Fukuyo et al. |
| 2010/0151202 A1 | 6/2010 | Fukumitsu |
| 2010/0176100 A1 | 7/2010 | Fukuyo et al. |
| 2010/0184271 A1 | 7/2010 | Sugiura et al. |
| 2010/0200550 A1 | 8/2010 | Kumagai |
| 2010/0203678 A1 | 8/2010 | Fukumitsu et al. |
| 2010/0203707 A1 | 8/2010 | Fujii et al. |
| 2010/0227453 A1 | 9/2010 | Sakamoto |
| 2010/0240159 A1 | 9/2010 | Kumagai et al. |
| 2010/0258539 A1 | 10/2010 | Sakamoto |
| 2010/0301521 A1 | 12/2010 | Uchiyama |
| 2010/0311313 A1 | 12/2010 | Uchiyama |
| 2010/0327416 A1 | 12/2010 | Fukumitsu |
| 2011/0000897 A1 | 1/2011 | Nakano et al. |
| 2011/0001220 A1 | 1/2011 | Sugiura et al. |
| 2011/0021004 A1 | 1/2011 | Fukuyo et al. |
| 2011/0027971 A1 | 2/2011 | Fukuyo et al. |
| 2011/0027972 A1 | 2/2011 | Fukuyo et al. |
| 2011/0037149 A1 | 2/2011 | Fukuyo et al. |
| 2011/0274128 A1 | 11/2011 | Fukumitsu et al. |

FOREIGN PATENT DOCUMENTS

| | | |
|---|---|---|
| EP | 0213546 | 3/1987 |
| EP | 0345752 A2 | 12/1989 |
| EP | 0 863 231 A1 | 9/1998 |
| EP | 1 022 778 A1 | 7/2000 |
| EP | 1 026 735 A2 | 8/2000 |
| EP | 1 138 516 A2 | 10/2001 |
| EP | 1 338 371 A1 | 8/2003 |
| EP | 1 498 216 A1 | 1/2005 |
| EP | 1 580 800 A1 | 9/2005 |
| GB | 2 322 006 A | 8/1998 |
| JP | 46-24989 | 7/1971 |
| JP | 48-012599 Y1 | 2/1973 |
| JP | 53-033050 A | 3/1978 |
| JP | 53-141573 A | 12/1978 |
| JP | 56-028630 A | 3/1981 |
| JP | 56-76522 | 6/1981 |
| JP | 56-128691 A | 10/1981 |
| JP | 58-036939 A | 3/1983 |
| JP | 58-57767 | 4/1983 |
| JP | 58-171783 A | 10/1983 |
| JP | 59-76687 | 5/1984 |
| JP | 59-130438 A | 7/1984 |
| JP | 59-141233 A | 8/1984 |
| JP | 59-150691 A | 8/1984 |
| JP | 59-181492 A | 10/1984 |
| JP | 60-144985 A | 7/1985 |
| JP | 60-167351 A | 8/1985 |
| JP | 61-112345 A | 5/1986 |
| JP | 61-121453 A | 6/1986 |
| JP | 61-220339 A | 9/1986 |
| JP | 62-004341 A | 1/1987 |
| JP | 62-098684 A | 5/1987 |
| JP | 63-215390 A | 9/1988 |
| JP | 63-278692 A | 11/1988 |
| JP | 64-038209 | 2/1989 |
| JP | 01-112130 A | 4/1989 |
| JP | 01-225509 A | 9/1989 |
| JP | 01-225510 A | 9/1989 |
| JP | 03-124486 A | 5/1991 |
| JP | 03-234043 A | 10/1991 |
| JP | 03-276662 A | 12/1991 |
| JP | 03-281073 A | 12/1991 |
| JP | 04-029352 A | 1/1992 |
| JP | 04-111800 A | 4/1992 |
| JP | 04-167985 A | 6/1992 |
| JP | 04-188847 A | 7/1992 |
| JP | 04-300084 A | 10/1992 |
| JP | 04-339586 A | 11/1992 |
| JP | 04-356942 A | 12/1992 |
| JP | 05-335726 A | 12/1993 |
| JP | 06-039572 A | 2/1994 |
| JP | 60-55640 A | 3/1994 |
| JP | 06-188310 A | 7/1994 |
| JP | 06-198475 A | 7/1994 |
| JP | 61-96439 A | 7/1994 |
| JP | 07-029855 A | 1/1995 |
| JP | 07-032281 A | 2/1995 |
| JP | 07-037840 A | 2/1995 |
| JP | 07-040336 A | 2/1995 |
| JP | 07-075955 A | 3/1995 |
| JP | 07-076167 A | 3/1995 |
| JP | 07-263382 A | 10/1995 |
| JP | 07-308791 A | 11/1995 |
| JP | 08-148692 A | 6/1996 |
| JP | 08-197271 A | 8/1996 |
| JP | 08-264488 A | 10/1996 |
| JP | 08-264491 A | 10/1996 |
| JP | 09-017756 A | 1/1997 |
| JP | 9-17831 | 1/1997 |
| JP | 09-150286 A | 6/1997 |
| JP | 09-213662 A | 8/1997 |
| JP | 09-216085 A | 8/1997 |
| JP | 09-260310 A | 10/1997 |
| JP | 09-263734 A | 10/1997 |
| JP | 10-034359 A | 2/1998 |
| JP | 10-071483 A | 3/1998 |
| JP | 10-163780 A | 6/1998 |
| JP | 10-214997 A | 8/1998 |
| JP | 10-233373 A | 9/1998 |
| JP | 10-305420 A | 11/1998 |
| JP | 10-321908 A | 12/1998 |
| JP | 11-028586 A | 2/1999 |
| JP | 11-071124 A | 3/1999 |
| JP | 11-121517 A | 4/1999 |
| JP | 11-138896 A | 5/1999 |
| JP | 11-156564 A | 6/1999 |
| JP | 11-160667 A | 6/1999 |
| JP | 11-162889 A | 6/1999 |
| JP | 11-163097 A | 6/1999 |
| JP | 11-163403 A | 6/1999 |
| JP | 11-177137 A | 7/1999 |
| JP | 11-177176 A | 7/1999 |
| JP | 11-204551 A | 7/1999 |
| JP | 11-207479 A | 8/1999 |
| JP | 11-221684 A | 8/1999 |
| JP | 11-224866 A | 8/1999 |
| JP | 11-267861 A | 10/1999 |
| JP | 2000-9991 | 1/2000 |
| JP | 2000-015467 A | 1/2000 |
| JP | 2000-042764 A | 2/2000 |
| JP | 2000-61677 | 2/2000 |
| JP | 2000-104040 A | 4/2000 |
| JP | 2000-124537 A | 4/2000 |
| JP | 2000-158156 A | 6/2000 |
| JP | 2000-195828 A | 7/2000 |
| JP | 2000-210785 | 8/2000 |
| JP | 2000-216114 A | 8/2000 |
| JP | 2000-219528 | 8/2000 |
| JP | 2000-237885 | 9/2000 |
| JP | 2000-237886 | 9/2000 |
| JP | 2000-247671 | 9/2000 |
| JP | 2000-249859 | 9/2000 |
| JP | 2000-294522 A | 10/2000 |

(56) References Cited

FOREIGN PATENT DOCUMENTS

| | | |
|---|---|---|
| JP | 2000-323441 A | 11/2000 |
| JP | 2000-349107 A | 12/2000 |
| JP | 2001-047264 A | 2/2001 |
| JP | 2001-064029 A | 3/2001 |
| JP | 2001-085736 A | 3/2001 |
| JP | 2001-127015 A | 5/2001 |
| JP | 2001-135654 A | 5/2001 |
| JP | 2001-144140 A | 5/2001 |
| JP | 2001-196282 A | 7/2001 |
| JP | 2001-250798 A | 9/2001 |
| JP | 2001-284292 A | 10/2001 |
| JP | 2001-326194 A | 11/2001 |
| JP | 2001-345252 A | 12/2001 |
| JP | 2002-026443 A | 1/2002 |
| JP | 2002-047025 A | 2/2002 |
| JP | 2002-050589 A | 2/2002 |
| JP | 2002-158276 A | 5/2002 |
| JP | 2002-192367 A | 7/2002 |
| JP | 2002-192368 A | 7/2002 |
| JP | 2002-192369 A | 7/2002 |
| JP | 2002-192370 A | 7/2002 |
| JP | 2002-192371 A | 7/2002 |
| JP | 2002-205180 A | 7/2002 |
| JP | 2002-205181 A | 7/2002 |
| JP | 2002-224878 A | 8/2002 |
| JP | 2002-226796 A | 8/2002 |
| JP | 2003-001458 A | 1/2003 |
| JP | 2003-017790 A | 1/2003 |
| JP | 2003-39184 | 2/2003 |
| JP | 2003-046177 A | 2/2003 |
| JP | 2003-154517 A | 5/2003 |
| JP | 2003-334812 A | 11/2003 |
| JP | 2003-338467 A | 11/2003 |
| JP | 2003-338468 A | 11/2003 |
| JP | 2003-338636 A | 11/2003 |
| JP | 2005-001001 A | 1/2005 |
| JP | 2005-047290 A | 2/2005 |
| JP | 2005-159378 A | 6/2005 |
| JP | 2005-159379 A | 6/2005 |
| JP | 2005-313237 A | 11/2005 |
| JP | 2006-128723 A | 5/2006 |
| JP | 2006-135355 A | 5/2006 |
| KR | 2001-017690 | 8/1919 |
| KR | 10-1999-0072974 | 9/1999 |
| KR | 2001-0017690 A | 3/2001 |
| TW | 165354 | 8/1991 |
| TW | 192484 | 10/1992 |
| TW | 219906 | 2/1994 |
| TW | 404871 B | 9/2000 |
| TW | 415036 B | 12/2000 |
| TW | 428295 B | 4/2001 |
| TW | 440551 B | 6/2001 |
| TW | 443581 U | 6/2001 |
| TW | 445684 B | 7/2001 |
| TW | 455914 B | 9/2001 |
| TW | 473896 B | 1/2002 |
| TW | 488001 B | 5/2002 |
| TW | 512451 B | 12/2002 |
| TW | 521310 B | 2/2003 |
| WO | WO-97/007927 A1 | 3/1997 |
| WO | WO-00/32349 A1 | 6/2000 |
| WO | WO-01/90709 A1 | 11/2001 |
| WO | WO-02/07927 A1 | 1/2002 |
| WO | WO-02/22301 A1 | 3/2002 |
| WO | WO-03/076118 A1 | 9/2003 |
| WO | WO-2004/082006 A1 | 9/2004 |

OTHER PUBLICATIONS

U.S. Office Action dated May 28, 2013 issued in U.S. Appl. No. 13/529,525.
U.S. Office Action dated Jun. 18, 2013 issued in U.S. Appl. No. 10/548,522.
Katsuyoshi Midorikawa, "Femto-byo Laser no Genjo to Kako Oyo", Dai 45 Kai Laser-Netsukako Kenkyukai Ronbunshu, Dec. 1998.
Tomokazu Sano et al., "Pico-byo Pulse Laser ni yoru Silicon no Kako Tokusei Hyoka—Tan-Pulse Tanhacho Laser ni yoru Denshi Zairyo no Seimitsu Bisai Kako(Dai 1 ho)-" Japan Welding Society Zenkoku Taikai Koen Gaiyo Mar. 13, 2000, 66th series, pp. 72-73.
Kiyotaka Miura, Kazuyuki Hirao, "Femto-byo Laser Shosha ni yoru Glass Naibu eno Hikari Yuki Kozo Keisei", Dai 42 Kai Laser Netsukako Kenkyukai Ronbunshu, Nov. 1997, ISBN: 4-947684-15-1, p. 104, line 4 to p. 109, lien 5.
Ken'ichi Hayashi, "Kotai Laser Kochoha ni yoru Glass Kiban no Naibu Marking", Dai 45 Kai Laser Netsukako Kenkyukai Ronbunshu, Oct. 1998, ISBN: 4-947684-321-6.
T. Yajima et al., New Version Laser Handbook, published by Asakusa Shoten, Jun. 15, 1989, pp. 666-669.
Tooling Machine Series, Laser Machining, published by Taiga Shuppan, Inc., Sep. 10, 1990 , pp. 91-96.
Electronic Material. No. 9 on 2002, published by Kogyo Chousakai, pp. 17-21 (with full English translation).
F. Fukuyo et al., "Stealth Dicing Technology for Ultla Thin Wafer", presented at 2003 10EP (International Conference on Electronics Packaging), Apr. 16-18, 2003, Tokyo, Japan.
T. Miyazaki, "Laser Beam Machining Technology," Published by Sangyo-Tosho Inc., May 31, 1991, First Edition. pp. 9-10.
F. Fukuyo, "The Stealth Dicing Technologies and Their Applications," Journal of Japan Laser Processing Society, vol. 12, No. 1, Feb. 2005, pp. 17-23, with English translation.
R. Sugiura et al., "The Stealth Dicing Technologies and Their Applications," Proceedings of the $63^{rd}$ Laser Materials Processing Conference, May 2005, pp. 115-123, with English abstract.
A. Ishii et al., CO2 Laser Processing Technology, Nikkan Kogyo Publishing Production, Dec. 21, 1992, pp. 63-65 (with partial English translation).
Journal of the Japan Society of Griding Engineers, vol. 47, No. 5, May 2003, pp. 229-231, English translation.
K. Hayashi, "Inner Glass Marking by Harmonics of Solid-state Laser", Proceedings of the 45th Laser Materials Processing Conference, Dec. 1998, pp. 23-28, with English abstract.
The 6th International Symposium on Laser Precision Microfabrication, Apr. 2005, Symposium Program and Technical Digest, including F. Fukuyo et al., "Stealth Dicing Technoligies and Their Applications," English abstract.
X. Liu et al., "Laser Ablation and Micromachining with Ultrashort Laser Pulses," IEEE Journal of Quantum Electronics, vol. 33, No. 10, Oct. 1997, pp. 1706-1716.
Office Action dated Apr. 25, 2012 from related (not counterpart) U.S. Appl. No. 12/912,427 (33 pages).
U.S. Appl. No. 12/461,969 to Fukuyo et al., filed Aug. 31, 2009.
U.S. Appl. No. 13/206,181, filed Aug. 9, 2011.
U.S. Appl. No. 13/269,274, filed Oct. 7, 2011.
U.S. Appl. No. 13/235,936, filed Sep. 19, 2011.
U.S. Appl. No. 13/233,662, filed Sep. 15, 2011.
U.S. Appl. No. 13/061,438, filed Apr. 26, 2011.
U.S. Appl. No. 13/107,056, filed May 13, 2011.
U.S. Appl. No. 13/151,877, filed Jun. 2, 2011.
U.S. Appl. No. 13/131,429, filed Jun. 28, 2011.
U.S. Appl. No. 13/143,636, filed Sep. 21, 2011.
U.S. Appl. No. 13/148,097, filed Aug. 26, 2011.
U.S. Appl. No. 13/262,995, filed Oct. 5, 2011.
U.S. Appl. No. 13/265,027, filed Oct. 18, 2011.
U.S. Appl. No. 13/213,175, filed Aug. 19, 2011.
K. Hirao et al., "Writing waveguides and gratings in silica and related materials by a femtosecond laser," Journal of Non-Crystalline Solids, vol. 239, Issues 1-3, Oct. 31, 1998, pp. 91-95.

LASER PROCESSING METHOD

This is a divisional application of copending application Ser. No. 10/507,392, filed on Apr. 8, 2005, which is a national stage application of PCT Application No. PCT/JP03/02945 filed on Mar. 12, 2003, designating the U.S.A., the entire contents of each of which are incorporated by reference herein in their entirety.

TECHNICAL FIELD

The present invention relates to a laser processing method used for cutting an object to be processed which is constructed such that a surface of a substrate is provided with a laminate part.

BACKGROUND ART

Recently, techniques for highly accurately cutting objects to be processed having various laminate structures such as one in which a semiconductor active layer of GaN or the like is grown as a crystal on an $Al_2O_3$ substrate for a semiconductor device, one in which a glass substrate is attached onto another glass substrate for a liquid crystal display unit, etc. have been in demand.

In general, blade dicing and diamond scribing have conventionally been employed for cutting the objects to be processed having these laminate structures.

The blade dicing is a method in which an object to be processed is shaven and cut with a diamond blade or the like. On the other hand, the diamond scribing is a method in which the front face of an object to be processed is provided with a scribe line by a diamond-point tool, and a knife edge is pressed against the rear face of the object along the scribe line, so as to divide and cut the object.

DISCLOSURE OF THE INVENTION

However, when the object to be processed is the above-mentioned one for a liquid crystal display unit, for example, a gap is provided between the glass substrates, where cutting dust and lubricating/washing water may enter in the blade dicing.

In the diamond scribing, not only the front face but also the rear face of the object to be processed must be provided with a scribe line in cases where the object has a substrate with a high degree of hardness such as an $Al_2O_3$ substrate, where the object is one in which glass substrates are attached to each other, etc., whereby cutting failures may occur because of positional deviations between the scribe lines provided in the front and rear faces.

In view of such circumstances, it is an object of the present invention to provide a laser processing method which can solve the problems mentioned above and cut, with a high accuracy, an object to be processed having various laminate structures.

For achieving the above-mentioned object, the present invention provides a laser processing method comprising the step of irradiating an object to be processed comprising a substrate and a laminate part disposed on a front face of the substrate with laser light while positioning a light-converging point at least within the substrate, so as to form a modified region due to multiphoton absorption at least within the substrate, and causing the modified region to form a starting point region for cutting along a line along which the object should be cut in the object inside by a predetermined distance from a laser light incident face of the object.

In this laser processing method, a starting point region for cutting along a desirable line along which the object should be cut for cutting the object to be processed can be formed within the substrate in the object by the modified region formed by a phenomenon of multiphoton absorption. Also, in view of the thickness, material, etc. of the laminate part disposed on the front face of the substrate, the distance from the front face of the substrate to the modified region in the starting point region for cutting can be controlled by regulating the position at which the light-converging point of the laser light is placed. Therefore, the object to be processed constructed such that the laminate part is disposed on the front face of the substrate can be broken and cut with a relatively small force, whereby objects to be processed having various laminate structures can be cut with a high accuracy.

Here, the laminate part disposed on the front face of the substrate refers to one deposited on the front face of the substrate, one attached to the front face of the substrate, etc., regardless of whether its material is different from or identical to that of the substrate. The laminate part disposed on the front face of the substrate includes one disposed in close contact with the substrate, one disposed with a gap from the substrate, etc. Examples of the laminate part include semiconductor active layers formed by crystal growth on the substrate, glass substrates attached onto other glass substrates, etc. The laminate part also includes one in which a plurality of layers are formed from materials different from each other. The expression "within the substrate" encompasses the front face of the substrate provided with the laminate part as well. The light-converging point refers to a location at which laser light is converged. The starting point region for cutting refers to a region to become a start point for cutting when the object to be processed is cut. Therefore, the starting point region for cutting is a part to cut where cutting is to be performed in the object. The starting point region for cutting may be produced by continuously forming a modified region or intermittently forming a modified region.

In another aspect, the present invention provides a laser processing method comprising the step of irradiating an object to be processed comprising a substrate and a laminate part disposed on a front face of the substrate with laser light while positioning a light-converging point at least within the substrate under a condition with a peak power density of at least $1 \times 10^6$ (W/cm$^2$) at the light-converging point and a pulse width of 1 μs or less, so as to form a modified region including a crack region at least within the substrate, and causing the modified region to form a starting point region for cutting along a line along which the object should be cut in the object inside by a predetermined distance from a laser light incident face of the object.

When the substrate is irradiated with laser light under this condition, a phenomenon of optical damage due to multiphoton absorption occurs within the substrate. This optical damage induces thermal distortion within the substrate, thereby forming a crack region within the substrate. The crack region is an example of the above-mentioned modified region. An example of the substrate subjected to this laser processing method is a member including glass.

In still another aspect, the present invention provides a laser processing method comprising the step of irradiating an object to be processed comprising a substrate and a laminate part disposed on a front face of the substrate with laser light while positioning a light-converging point at least within the substrate under a condition with a peak power density of at least $1 \times 10^8$ (W/cm$^2$) at the light-converging point and a pulse width of 1 μs or less, so as to form a modified region including a molten processed region at least within the substrate, and causing the modified region to form a starting point region for cutting along a line along which the object should be cut in the object inside by a predetermined distance from a laser light incident face of the object.

When the substrate is irradiated with laser light under this condition, the inside of the object is locally heated by multiphoton absorption. This heating forms a molten processed region within the object. The molten processed region is an example of the above-mentioned modified region. An example of the object to be processed by this laser processing method is a member including a semiconductor material.

In still another aspect, the present invention provides a laser processing method comprising the step of irradiating an object to be processed comprising a substrate and a laminate part disposed on a front face of the substrate with laser light while positioning a light-converging point at least within the substrate under a condition with a peak power density of at least $1 \times 10^8$ (W/cm$^2$) at the light-converging point and a pulse width of 1 μs or less, so as to form a modified region including a refractive index change region which is a region with a changed refractive index at least within the substrate, and causing the modified region to form a starting point region for cutting along a line along which the object should be cut in the object inside by a predetermined distance from a laser light incident face of the object.

When the substrate is irradiated with laser light under this condition, multiphoton absorption occurs within the substrate. However, since the pulse width is very short, the energy caused by multiphoton absorption is not transformed into thermal energy, so that a permanent structural change such as ionic valence change, crystallization, or polarization orientation is induced within the substrate, whereby a refractive index change region is formed. The refractive index change region is an example of the modified region. An example of the substrate subjected to this laser processing method is a member including glass.

In still another aspect, the present invention provides a laser processing method comprising the step of irradiating an object to be processed comprising a substrate and a laminate part disposed on a front face of the substrate with laser light while positioning a light-converging point at least within the substrate, so as to form a modified region at least within the substrate, and causing the modified region to form a starting point region for cutting along a line along which the object should be cut in the object inside by a predetermined distance from a laser light incident face of the object. The modified region may include at least one of a crack region which is a region where a crack is generated within the substrate, a molten processed region which is a region subjected to melting within the substrate, and a refractive index change region which is a region with a changed refractive index within the substrate.

This laser processing method can highly accurately cut objects to be processed having various laminate structures because of reasons similar to those of the above-mentioned laser processing methods in accordance with the present invention. The modified region may be formed because of multiphoton absorption or other reasons.

In still another aspect, the present invention provides a laser processing method comprising the step of irradiating an object to be processed comprising a substrate and a laminate part disposed on a front face of the substrate with laser light while positioning a light-converging point within the substrate, irradiating the object with laser light while positioning a light-converging point within the laminate part, so as to form respective modified regions within the substrate and laminate part, and causing the modified regions to form a starting point region for cutting along a line along which the object should be cut in the object inside by a predetermined distance from a laser light incident face of the object. The modified region may include at least one of a crack region which is a region where a crack is generated within the substrate, a molten processed region which is a region subjected to melting within the substrate, and a refractive index change region which is a region with a changed refractive index within the substrate.

This laser processing method forms a starting point region for cutting along a line along which the object should be cut not only within the substrate but also within the laminate part, so that the object to be processed can be cut with a smaller force, whereby objects having various laminate structures can be cut with a high accuracy. The forming of the modified region within the substrate and the forming of the modified region within the laminate part may be effected simultaneously while using respective laser light sources different from each other or separately (in any order) while using the same laser light source, for example. The modified region may be formed because of multiphoton absorption or other reasons.

In still another aspect, the present invention provides a laser processing method comprising the step of irradiating an object to be processed comprising a substrate and a laminate part disposed on a front face of the substrate with laser light while positioning a light-converging point at least within the substrate, so as to form a modified region along a line along which the object should be cut at least within the substrate, thereby cutting the object. The modified region may include at least one of a crack region which is a region where a crack is generated within the substrate, a molten processed region which is a region subjected to melting within the substrate, and a refractive index change region which is a region with a changed refractive index within the substrate.

In this laser processing method, a fracture naturally grows in the substrate and laminate part from the modified region formed within the substrate acting as a start point so as to extend along the line along which the object should be cut, whereby the object can be cut. This laser processing method is effective when the laminate part is thinner than the substrate, for example. The modified region may be formed because of multiphoton absorption or other reasons.

Preferably, in the above-mentioned laser processing methods in accordance with the present invention, the laser light irradiating the substrate while positioning the light-converging point therewithin irradiates the substrate from the rear face side of the substrate. In this case, even when the laminate part disposed on the front face of the substrate has a light-shielding or absorbing characteristic for laser light, the modified region can form a starting point region for cutting within the substrate of the object.

For achieving the above-mentioned object, in still another aspect, the present invention provides a laser processing method comprising the steps of irradiating a substrate with laser light while positioning a light-converging point within the substrate, so as to form a modified region due to multiphoton absorption within the substrate, and causing the modified region to form a starting point region for cutting along a line along which the object should be cut in the object inside by a predetermined distance from a laser light incident face of the substrate; and providing a front face of the substrate with a laminate part after the step of forming the starting point region for cutting.

In this laser processing method, a starting point region for cutting is formed within a substrate before a laminate part is disposed on the front face of the substrate. Since the modified region is formed only locally by multiphoton absorption, the laser light is hardly absorbed by the front face of the substrate, whereby the front face of the substrate does not melt. Therefore, as in the case where no modified region is formed within the substrate, the front face of the substrate can be provided with the laminate part, so as to form the object to be processed. Because of the same reason as that mentioned above, thus formed object to be processed can be broken and cut with a relatively small force from the starting point region for cutting formed within the substrate as a start point, whereby objects to be processed having various laminate structures can be cut with a high accuracy.

BEST MODES FOR CARRYING OUT THE INVENTION

In the following, a preferred embodiment of the present invention will be explained in detail with reference to drawings. In the laser processing method in accordance with this embodiment, a modified region due to multiphoton absorption is formed within an object to be processed. Hence, the laser processing method, multiphoton absorption in particular, will be explained at first.

A material becomes optically transparent if its absorption bandgap $E_G$ is greater than a photon energy hv. Hence, the condition under which absorption occurs in the material is hv>$E_G$. However, even when optically transparent, the material yields absorption under the condition of nhv>$E_G$ (n=2, 3, 4, . . . ) if the intensity of laser light is very high. This phenomenon is known as multiphoton absorption. In the case of pulse waves, the intensity of laser light is determined by the peak power density (W/cm$^2$) of laser light at a light-converging point thereof. The multiphoton absorption occurs, for example, at a peak power density (W/cm$^2$) of 1×10$^8$ (W/cm$^2$) or higher. The peak power density is determined by (energy per pulse of laser light at the light-converging point)/(laser light beam spot cross-sectional area×pulse width). In the case of a continuous wave, the intensity of laser light is determined by the electric field strength (W/cm$^2$) of laser light at the light-converging point.

Figure 1:
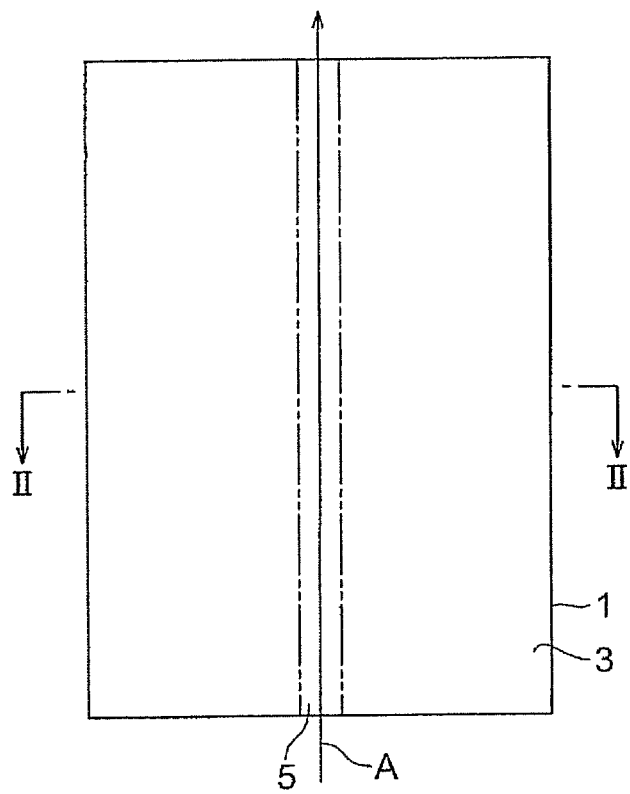
FIG. 1 is a plan view of an object to be processed during laser processing in the laser processing method in accordance with an embodiment of the present invention.
Figure 2:
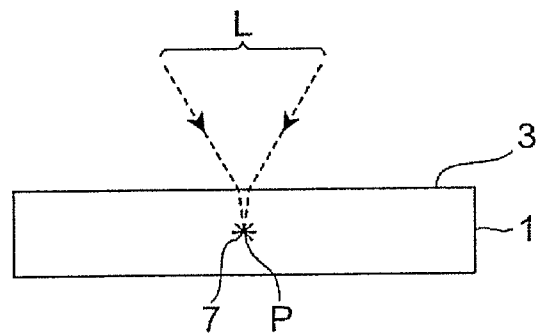
FIG. 2 is a sectional view of the object to be processed taken along the line II-II of FIG. 1.
Figure 3:
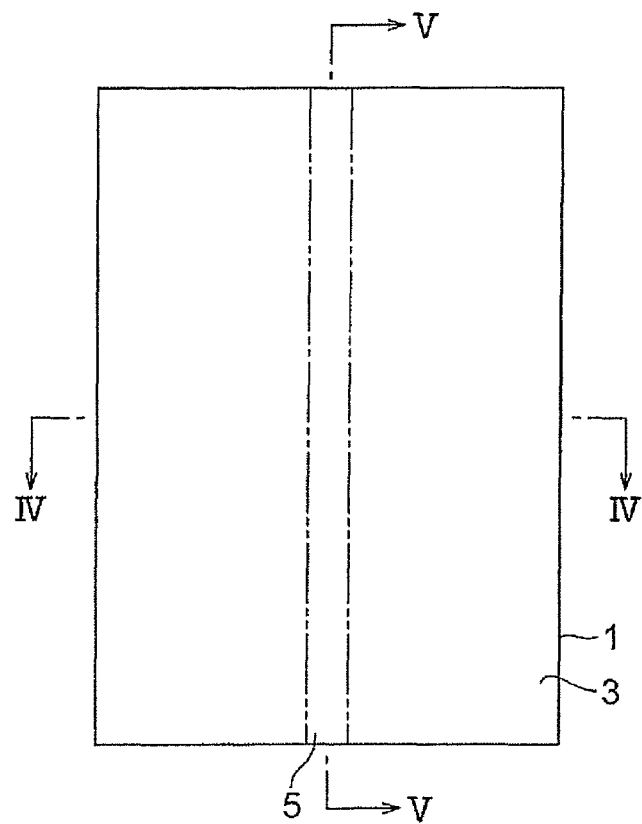
FIG. 3 is a plan view of the object to be processed after laser processing by the laser processing method in accordance with the embodiment.
Figure 4:
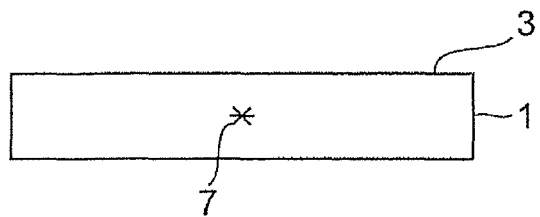
FIG. 4 is a sectional view of the object to be processed taken along the line IV-IV of FIG. 3.
Figure 5:
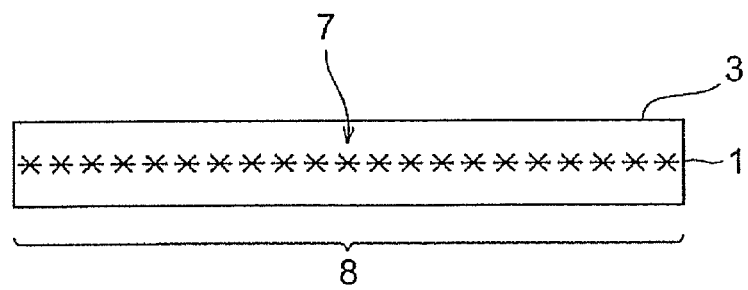
FIG. 5 is a sectional view of the object to be processed taken along the line V-V of FIG. 3.

The principle of laser processing in accordance with the embodiment utilizing such multiphoton absorption will now be explained with reference to FIGS. 1 to 6. FIG. 1 is a plan view of an object to be processed 1 during laser processing; FIG. 2 is a sectional view of the object 1 taken along the line II-II of FIG. 1; FIG. 3 is a plan view of the object 1 after laser processing; FIG. 4 is a sectional view of the object 1 taken along the line IV-IV of FIG. 3; FIG. 5 is a sectional view of the object 1 taken along the line V-V of FIG. 3; and FIG. 6 is a plan view of the cut object 1.

As shown in FIGS. 1 and 2, the front face 3 of the object 1 has a desirable line along which the object should be cut 5 for cutting the object 1. The line along which the object should be cut 5 is a linearly extending virtual line (the object 1 may also be formed with an actual line acting as the line along which the object should be cut 5). In the laser processing in accordance with this embodiment, the object 1 is irradiated with laser light L such that a light-converging point P is positioned within the object 1 under a condition causing multiphoton absorption, so as to form a modified region 7. Here, the light-converging point is a location where the laser light L is converged.

The laser light L is relatively moved along the line along which the object should be cut 5 (in the direction of arrow A), so as to move the light-converging point P along the line along which the object should be cut 5. This forms the modified region 7 along the line along which the object should be cut 5 only within the object 1 as shown in FIGS. 3 to 5, and the modified region 7 forms a starting point region for cutting (part to cut) 8. In the laser processing method in accordance with this embodiment, no modified region 7 is formed upon heating the object 1 by causing the object 1 to absorb the laser light L. Instead, the laser light L is transmitted through the object 1, so as to generate multiphoton absorption within the object 1, thereby forming the modified region 7. Hence, the laser light L is hardly absorbed by the front face 3 of the object 1, whereby the front face 3 of the object 1 does not melt.

Figure 6:
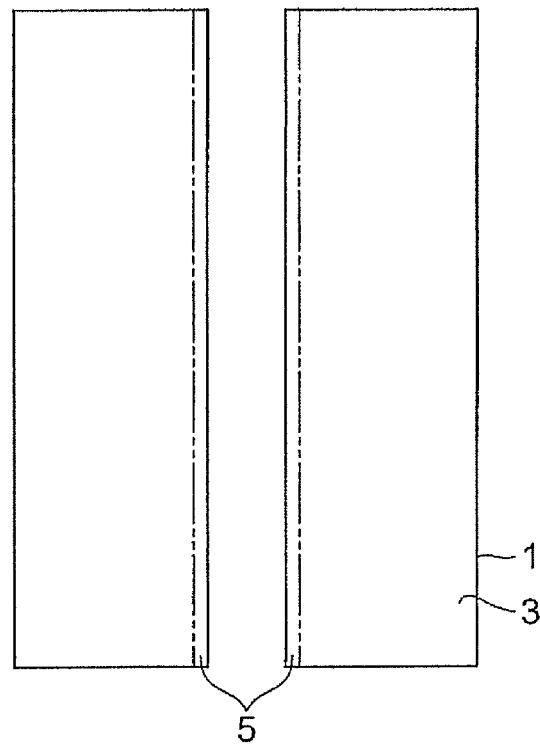
FIG. 6 is a plan view of the object to be processed cut by the laser processing method in accordance with the embodiment.

If a start point exists at a location to cut when cutting the object 1, the object 1 fractures from this start point and thus can be cut with a relatively small force as shown in FIG. 6. This makes it possible to cut the object 1 without generating unnecessary fractures in the front face 3 of the object 1.

There seem to be the following two ways of cutting the object from the starting point region for cutting acting as a start point. The first case is where, after forming the starting point region for cutting, an artificial force is applied to the object, so that the object fractures from the starting point region for cutting acting as a start point, whereby the object is cut. This is the cutting in the case where the object has a large thickness, for example. The application of an artificial force encompasses application of bending stress and shearing stress along the starting point region for cutting of the object, and exertion of a temperature difference upon the object to generate thermal stress, for example. The other case is where a starting point region for cutting is formed, so that the object is naturally fractured in a cross-sectional direction (thickness direction) of the object from the starting point region for cutting acting as a start point, whereby the object is cut. This is enabled, for example, by forming the starting point region for cutting by a single row of modified regions when the object has a small thickness, and by a plurality of rows of modified regions aligned in the thickness direction when the object has a large thickness. Even in the case of natural fracturing, fractures do not extend to the front face at a location not formed with the starting point region for cutting in the part to cut, whereby only the part corresponding to the location formed with the starting point region for cutting can be fractured. Thus, fracturing can be regulated well. Such a fracturing method with favorable controllability is quite effective, since objects to be processed such as silicon wafers have recently been apt to become thinner.

The modified region formed by multiphoton absorption in this embodiment includes the following cases (1) to (3):

(1) Case where the Modified Region is a Crack Region Including One or a Plurality of Cracks An object to be processed (e.g., glass or a piezoelectric material made of $LiTaO_3$) is irradiated with laser light while a light-converging point is positioned therewithin under a condition with an electric field intensity of at least $1\times10^8$ ($W/cm^2$) at the light-converging point and a pulse width of 1 μs or less. This pulse width is a condition under which a crack region can be formed only within the object while generating multiphoton absorption without causing unnecessary damages to the object. This generates a phenomenon of optical damage due to multiphoton absorption within the object. This optical damage induces thermal distortion within the object, thereby forming a crack region therewithin. The upper limit of electric field intensity is $1\times10^{12}$ ($W/cm^2$), for example. The pulse width is preferably 1 ns to 200 ns, for example. The forming of a crack region due to multiphoton absorption is described, for example, in "Internal Marking of Glass Substrate by Solid-state Laser Harmonics", *Proceedings of 45th Laser Materials Processing Conference* (December 1998), pp. 23-28.

The inventors determined relationships between the electric field intensity and the magnitude of crack by an experiment. Conditions for the experiment are as follows:

(A) Object to be processed: Pyrex (registered trademark) glass (having a thickness of 700 μm)

(B) Laser
Light source: semiconductor laser pumping Nd:YAG laser
Wavelength: 1064 nm
Laser light spot cross-sectional area: $3.14\times10^{-8}$ $cm^2$
Oscillation mode: Q-switch pulse
Repetition frequency: 100 kHz
Pulse width: 30 ns
Output: output<1 mJ/pulse
Laser light quality: $TEM_{oo}$
Polarization characteristic: linear polarization (C) Light-converging lens
Transmittance with respect to laser light wavelength: 60%

(D) Moving speed of a mounting table mounting the object: 100 mm/sec

Here, the laser light quality being $TEM_{00}$ indicates that the light convergence is so high that light can be converged up to about the wavelength of laser light.

Figure 7:
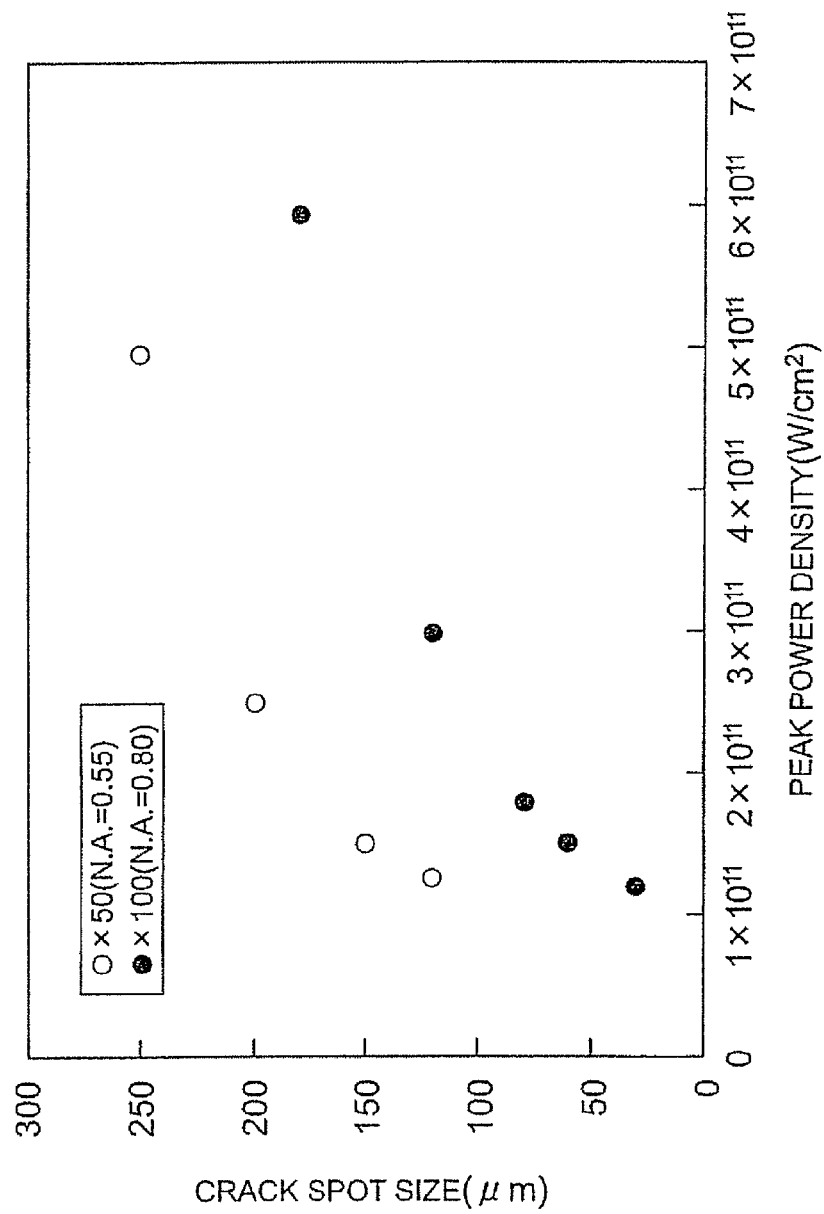
FIG. 7 is a graph showing relationships between the electric field intensity and crack spot size in the laser processing method in accordance with the embodiment.

FIG. 7 is a graph showing the results of the above-mentioned experiment. The abscissa indicates peak power density. Since laser light is pulse laser light, its electric field intensity is represented by the peak power density. The ordinate indicates the size of a crack part (crack spot) formed within the object processed by one pulse of laser light. Crack spots gather, so as to form a crack region. The size of a crack spot refers to that of the part of dimensions of the crack spot yielding the maximum length. The data indicated by black circles in the graph refers to a case where the light-converging lens (C) has a magnification of ×100 and a numerical aperture (NA) of 0.80. On the other hand, the data indicated by white circles in the graph refers to a case where the light-converging lens (C) has a magnification of ×50 and a numerical aperture (NA) of 0.55. It is seen that crack spots begin to occur within the object when the peak power density reaches about $10^{11}$ ($W/cm^2$), and become greater as the peak power density increases.

Figure 8:
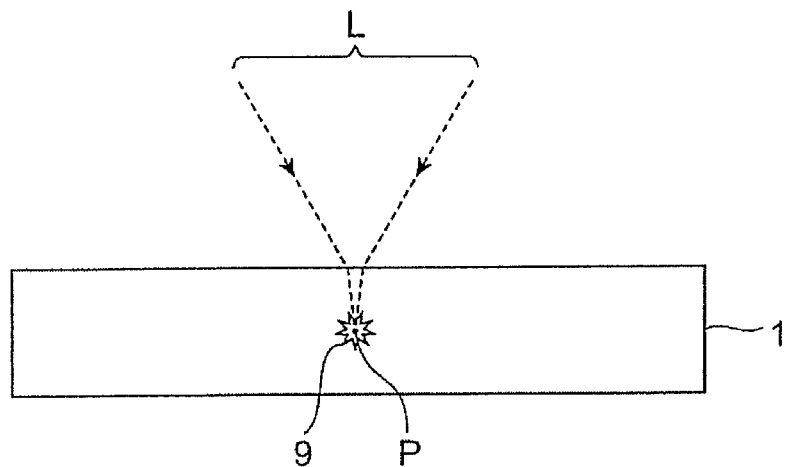
FIG. 8 is a sectional view of the object to be processed in a first step of the laser processing method in accordance with the embodiment.
Figure 9:
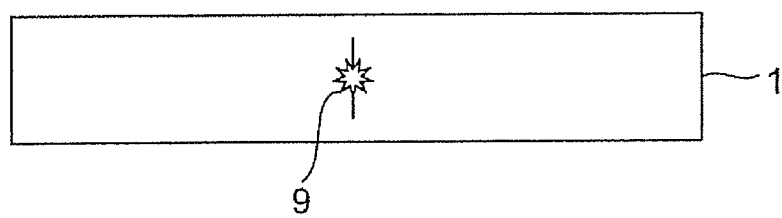
FIG. 9 is a sectional view of the object to be processed in a second step of the laser processing method in accordance with the embodiment.
Figure 10:
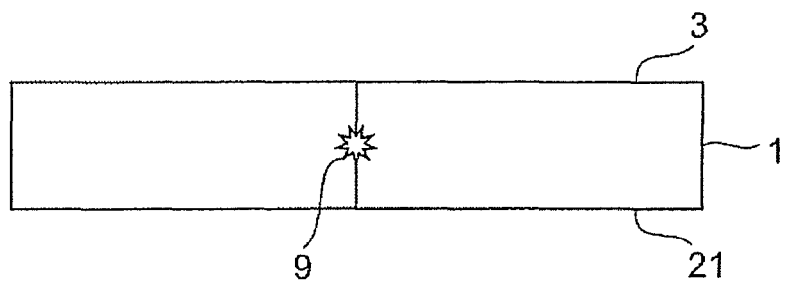
FIG. 10 is a sectional view of the object to be processed in a third step of the laser processing method in accordance with the embodiment.
Figure 11:
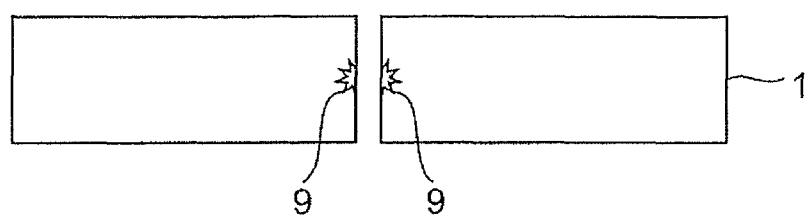
FIG. 11 is a sectional view of the object to be processed in a fourth step of the laser processing method in accordance with the embodiment.

A mechanism by which the object to be processed is cut upon formation of a crack region in the laser processing in accordance with this embodiment will now be explained with reference to FIGS. 8 to 11. As shown in FIG. 8, the object 1 is irradiated with laser light L while positioning the light-converging point P within the object 1 under a condition where multiphoton absorption occurs, so as to form a crack region 9 therewithin along a line along which the object should be cut. The crack region 9 is a region including one or a plurality of crack spots. The crack region 9 forms a starting point region for cutting. As shown in FIG. 9, the crack further grows while using the crack region 9 as a start point (i.e., using the starting point region for cutting as a start point). As shown in FIG. 10, the crack reaches the front face 3 and rear face 21 of the object 1. As shown in FIG. 11, the object 1 breaks, so as to be cut. The crack reaching the front face and rear face of the object may grow naturally or grow as a force is applied to the object.

(2) Case where the Modified Region is a Molten Processed Region

An object to be processed (e.g., a semiconductor material such as silicon) is irradiated with laser light while a light-converging point is positioned therewithin under a condition with an electric field intensity of at least $1 \times 10^8$ (W/cm$^2$) at the light-converging point and a pulse width of 1 µs or less. As a consequence, the inside of the object is locally heated by multiphoton absorption. This heating forms a molten processed region within the object. The molten processed region refers to a region once melted and then re-solidified, a region just in a melted state, or a region in the process of re-solidifying from its melted state, and may also be defined as a phase-changed region or a region having changed its crystal structure. The molten processed region may also be regarded as a region in which a certain structure has changed into another structure in monocrystal, amorphous, and polycrystal structures. Namely, it refers to a region in which a monocrystal structure has changed into an amorphous structure, a region in which a monocrystal structure has changed into a polycrystal structure, and a region in which a monocrystal structure has changed into a structure including an amorphous structure and a polycrystal structure, for example. When the object is a silicon monocrystal structure, the molten processed region is an amorphous silicon structure, for example. The upper limit of electric field intensity is $1 \times 10^{12}$ (W/cm$^2$) for example. The pulse width is preferably 1 ns to 200 ns, for example.

By an experiment, the inventors have verified that a molten processed region is formed within a silicon wafer. Conditions for the experiment are as follows:

(A) Object to be processed: silicon wafer (having a thickness of 350 µm and an outer diameter of 4 inches)

(B) Laser
Light source: semiconductor laser pumping Nd:YAG laser
Wavelength: 1064 nm
Laser light spot cross-sectional area: $3.14 \times 10^{-8}$ cm$^2$
Oscillation mode: Q-switch pulse
Repetition frequency: 100 kHz
Pulse width: 30 ns
Output: 20 µJ/pulse
Laser light quality: TEM$_{00}$
Polarization characteristic: linear polarization (C) Light-converging lens
Magnification: ×50
N. A.: 0.55
Transmittance with respect to laser light wavelength: 60%

(D) Moving speed of a mounting table mounting the object: 100 mm/sec

Figure 12:
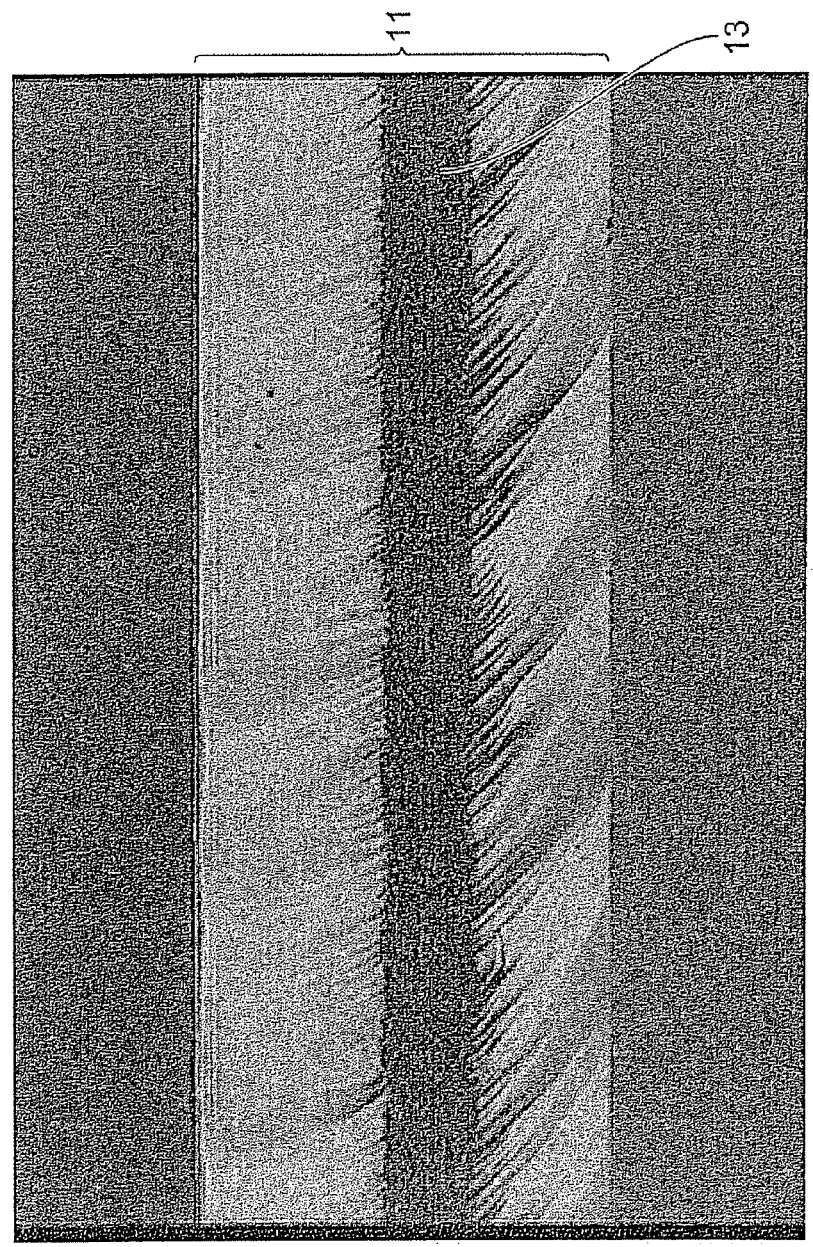
FIG. 12 is a view showing a photograph of a cut section in a part of a silicon wafer cut by the laser processing method in accordance with the embodiment.

FIG. 12 is a view showing a photograph of a cut section in a part of a silicon wafer cut by laser processing under the above-mentioned conditions. A molten processed region 13 is formed within a silicon wafer 11. The size of the molten processed region 13 formed under the above-mentioned conditions is about 100 µm in the thickness direction.

Figure 13:
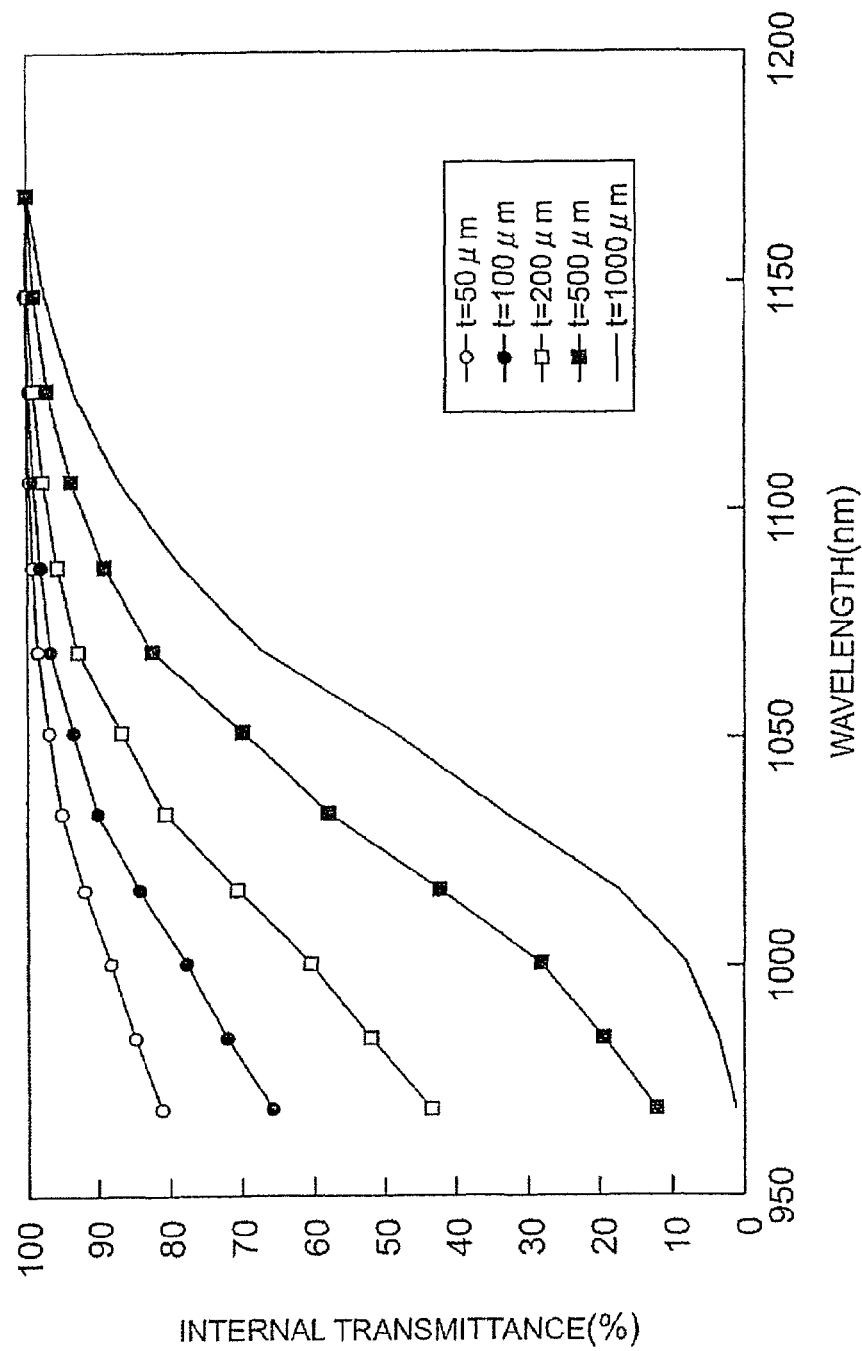
FIG. 13 is a graph showing relationships between the laser light wavelength and the internal transmittance of a silicon substrate in the laser processing method in accordance with the embodiment.

The fact that the molten processed region 13 is formed by multiphoton absorption will now be explained. FIG. 13 is a graph showing relationships between the wavelength of laser light and the transmittance within the silicon substrate. Here, respective reflecting components on the front face side and rear face side of the silicon substrate are eliminated, whereby only the transmittance therewithin is represented. The above-mentioned relationships are shown in the cases where the thickness t of the silicon substrate is 50 µm, 100 µm, 200 µm, 500 µm, and 1000 µm, respectively.

For example, it is seen that laser light is transmitted through the silicon substrate by at least 80% at 1064 nm, where the wavelength of Nd:YAG laser is located, when the silicon substrate has a thickness of 500 µm or less. Since the silicon wafer 11 shown in FIG. 12 has a thickness of 350 µm, the molten processed region 13 due to multiphoton absorption is formed near the center of the silicon wafer, i.e., at a part separated from the front face by 175 µm. The transmittance in this case is 90% or greater with reference to a silicon wafer having a thickness of 200 µm, whereby the laser light is absorbed within the silicon wafer 11 only slightly and is substantially transmitted therethrough. This means that the molten processed region 13 is not formed by laser light absorption within the silicon wafer 11 (i.e., not formed upon usual heating with laser light), but by multiphoton absorption. The forming of a molten processed region by multiphoton absorption is described, for example, in "Processing Characteristic Evaluation of Silicon by Picosecond Pulse Laser", *Preprints of the National Meeting of Japan Welding Society*, No. 66 (April 2000), pp. 72-73.

Here, a fracture is generated in the cross-sectional direction while using a molten processed region as a start point, whereby the silicon wafer is cut when the fracture reaches the front face and rear face of the silicon wafer. The fracture reaching the front face and rear face of the silicon wafer may grow naturally or grow as a force is applied to the silicon wafer. The fracture naturally grows from the starting point region for cutting to the front face and rear face of the silicon wafer in any of the cases where the fracture grows from the molten processed region in a melted state and where the fracture grows from the molten processed region in the process of re-solidifying from the melted state. In any of these cases, the molten processed region is formed only within the silicon wafer. In the cut section after cutting, the molten processed region is formed only therewithin as shown in FIG. 12. When a molten processed region is formed within the object, unnecessary fractures deviating from a line along which the object should be cut are hard to occur at the time of fracturing, which makes it easier to control the fracturing.

(3) Case where the Modified Region is a Refractive Index Change Region

An object to be processed (e.g., glass) is irradiated with laser light while a light-converging point is positioned therewithin under a condition with an electric field intensity of at least $1 \times 10^8$ (W/cm$^2$) at the light-converging point and a pulse width of 1 ns or less. When multiphoton absorption is generated within the object with a very short pulse width, the energy caused by multiphoton absorption is not transformed into thermal energy, so that a permanent structural change such as ionic valence change, crystallization, or polarization orientation is induced within the object, whereby a refractive index change region is formed. The upper limit of electric field intensity is $1 \times 10^{12}$ (W/cm$^2$) for example. The pulse width is preferably 1 ns or less, more preferably 1 ps or less, for example. The forming of a refractive index change region by multiphoton absorption is described, for example, in "Formation of Photoinduced Structure within Glass by Femtosecond Laser Irradiation", *Proceedings of 42th Laser Materials Processing Conference* (November 1997), pp. 105-111.

The cases of (1) to (3) are explained as modified regions formed by multiphoton absorption in the foregoing. When a starting point region for cutting is formed as follows in view of the crystal structure of a wafer-like object to be processed, the cleavage property thereof, and the like, the substrate can be cut with a smaller force and a higher accuracy while using the starting point region for cutting as a start point.

Namely, in the case of a substrate made of a monocrystal semiconductor having a diamond structure such as silicon, the starting point region for cutting is preferably formed in a direction along the (111) plane (first cleavage plane) or (110) plane (second cleavage plane). In the case of a substrate made of a III-V family compound semiconductor having a zinc ore type structure such as GaAs, the starting point region for cutting is preferably formed in a direction along the (110) plane. In the case of a substrate having a hexagonal crystal structure such as sapphire ($Al_2O_3$), a starting point region for cutting is preferably formed in a direction along the (1120) plane (A plane) or (1100) plane (M plane) while using the (0001) plane (C plane) as a principal plane.

When the substrate is formed with an orientation flat along a direction to be formed with the starting point region for cutting (e.g., in a direction along the (111) plane in the monocrystal silicon substrate) or a direction orthogonal to the direction to be formed with the starting point region for cutting, the starting point region for cutting extending along the direction to be formed with the starting point region for cutting can be formed in the substrate in an easy and accurate manner with reference to the orientation flat.

Figure 14:
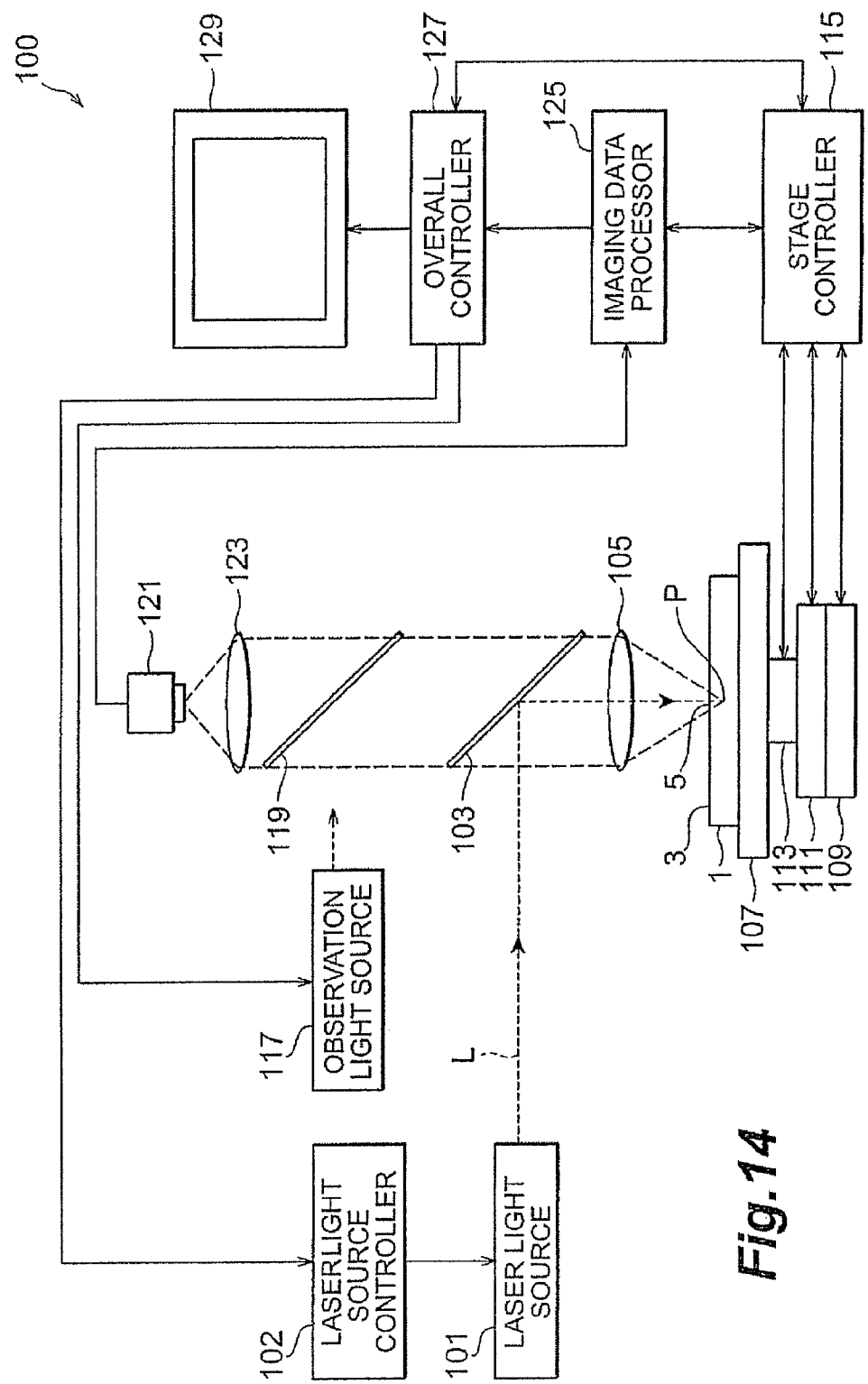
FIG. 14 is a schematic diagram of the laser processing apparatus in accordance with the embodiment.

A laser processing apparatus used in the above-mentioned laser processing method will now be explained with reference to FIG. 14. FIG. 14 is a schematic diagram of the laser processing apparatus 100.

The laser processing apparatus 100 comprises a laser light source 101 for generating laser light L; a laser light source controller 102 for controlling the laser light source 101 so as to regulate the output, pulse width, etc. of laser light L and the like; a dichroic mirror 103, arranged so as to change the orientation of the optical axis of laser light L by 90°, having a function of reflecting the laser light L; a light-converging lens 105 for converging the laser light L reflected by the dichroic mirror 103; a mounting table 107 for mounting an object to be processed 1 irradiated with the laser light L converged by the light-converging lens 105; an X-axis stage 109 for moving the mounting table 107 in the X-axis direction; a Y-axis stage 111 for moving the mounting table 107 in the Y-axis direction orthogonal to the X-axis direction; a Z-axis stage 113 for moving the mounting table 107 in the Z-axis direction orthogonal to the X- and Y-axis directions; and a stage controller 115 for controlling the movement of these three stages 109, 111, 113.

This movement of light-converging point P in X(Y)-axis direction is effected by moving the object 1 in the X(Y)-axis direction by the X(Y)-axis stage 109 (111). The Z-axis direction is a direction orthogonal to the front face 3 of the object 1, and thus becomes the direction of focal depth of laser light L incident on the object 1. Therefore, moving the Z-axis stage 113 in the Z-axis direction can position the light-converging point P of laser light L within the object 1. This can place the light-converging point P at a desirable position such as the substrate, the laminate part on the substrate, or the like in the object 1 when the object 1 has a multilayer structure, for example.

The laser light source 101 is an Nd:YAG laser generating pulse laser light. Known as other kinds of laser usable as the laser light source 101 include Nd:$YVO_4$ laser, Nd:YLF laser, and titanium sapphire laser. Though pulse laser light is used for processing the object 1 in this embodiment, continuous wave laser light may be used as long as it can cause multiphoton absorption.

The laser processing apparatus 100 further comprises an observation light source 117 for generating a visible light beam for irradiating the object 1 mounted on the mounting table 107, and a visible light beam splitter 119 disposed on the same optical axis as that of the dichroic mirror 103 and light-converging lens 105. The dichroic mirror 103 is disposed between the beam splitter 119 and light-converging lens 105. The beam splitter 119 has a function of reflecting about a half of a visual light beam and transmitting the remaining half therethrough, and is arranged so as to change the orientation of the optical axis of the visual light beam by 90°. About a half of the visible light beam generated from the observation light source 117 is reflected by the beam splitter 119, and thus reflected visible light beam is transmitted through the dichroic mirror 103 and light-converging lens 105, so as to illuminate the front face 3 of the object 1 including the line along which the object should be cut 5 and the like. When the object 1 is mounted on the mounting table 107 such that the rear face of the object 1 faces the light-converging lens 105, the "front face" mentioned above becomes the "rear face" as a matter of course.

The laser processing apparatus 100 further comprises an image pickup device 121 and an imaging lens 123 which are disposed on the same optical axis as that of the beam splitter 119, dichroic mirror 103, and light-converging lens 105. An example of the image pickup device 121 is a CCD camera. The reflected light of the visual light beam having illuminated the front face 3 including the line along which the object should be cut 5 and the like is transmitted through the light-converging lens 105, dichroic mirror 103, and beam splitter 119 and forms an image by way of the imaging lens 123, whereas thus formed image is captured by the image pickup device 121, so as to yield imaging data.

The laser processing apparatus 100 further comprises an imaging data processor 125 for inputting the imaging data outputted from the image pickup device 121, an overall controller 127 for controlling the laser processing apparatus 100 as a whole, and a monitor 129. According to the imaging data, the imaging data processor 125 calculates focal point data for positioning the focal point of the visible light generated from the observation light source 117 onto the front face 3 of the object 1. According to the focal point data, the stage controller 115 controls the movement of the Z-axis stage 113, so that the focal point of visible light is positioned on the front face 3 of the object. Hence, the imaging data processor 125 functions as an autofocus unit. Also, according to the imaging data, the imaging data processor 125 calculates image data such as an enlarged image of the front face 3. The image data is sent to the overall controller 127, subjected to various kinds of processing therein, and then sent to the monitor 129. As a consequence, an enlarged image or the like is displayed on the monitor 129.

Data from the stage controller 115, image data from the imaging data processor 125, and the like are fed into the overall controller 127. According to these data as well, the overall controller 127 regulates the laser light source controller 102, observation light source 117, and stage controller 115, thereby controlling the laser processing apparatus 100 as a whole. Thus, the overall controller 127 functions as a computer unit.

The laser processing method in accordance with this embodiment will now be explained with reference to FIGS.

Figure 15:
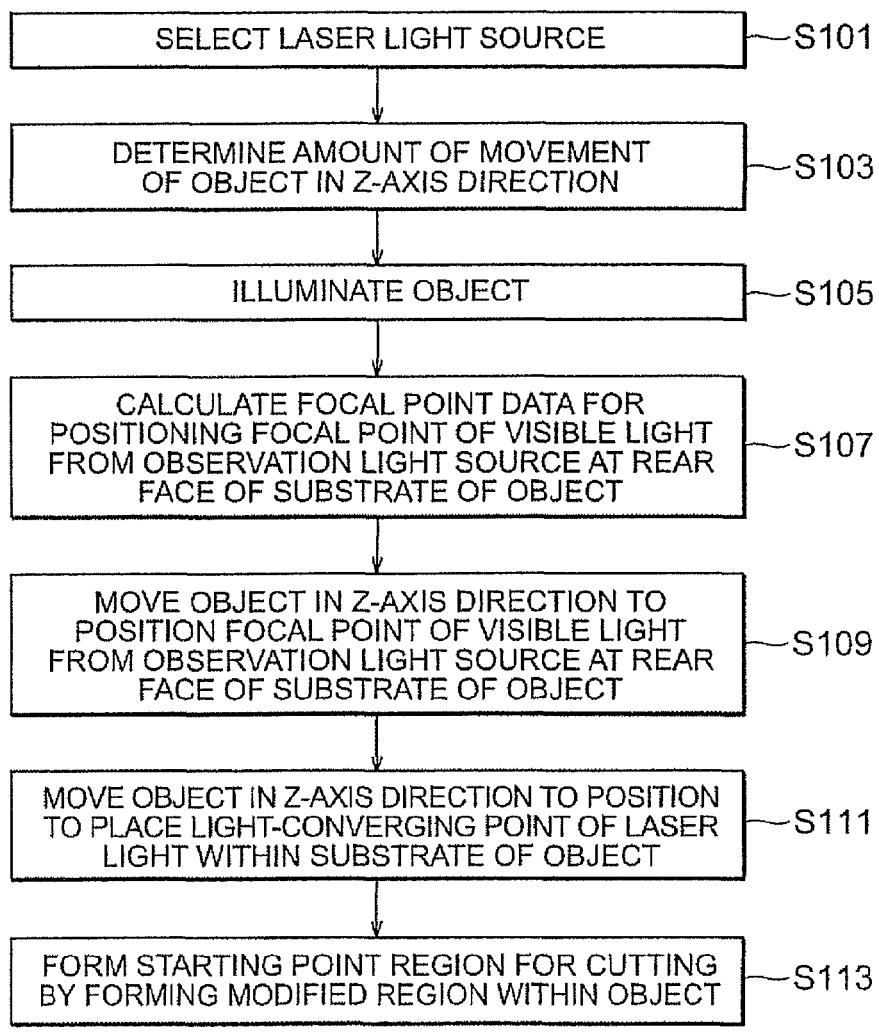
FIG. 15 is a flowchart for explaining the laser processing method in accordance with the embodiment.

14 and 15. FIG. 15 is a flowchart for explaining the step of forming a starting point region for cutting. In this embodiment, the object to be processed 1 comprises a substrate and a laminate part disposed on the front face of the substrate. The object 1 is mounted on the mounting table 107 of the laser processing apparatus 100 shown in FIG. 14 such that the rear face of the substrate faces the light-converging lens 105. Namely, the laser light L irradiates the object 1 from the rear face side of the substrate therein.

First, light absorption characteristics of the substrate of the object 1 are determined by a spectrophotometer or the like which is not depicted. According to the results of measurement, a laser light source 101 generating laser light L having a wavelength to which the substrate of the object 1 is transparent or exhibits a low absorption is chosen (S101). Since the laser light L irradiates the substrate from the rear face side thereof, laser processing is not obstructed even when the laminate part disposed on the substrate has a light-shielding or absorbing characteristic for the laser light.

Subsequently, in view of the thickness and refractive index of the object 1, the amount of movement of the object 1 in the Z-axis direction in the laser processing apparatus 100 is determined (S103). This is an amount of movement of the object 1 in the Z-axis direction with reference to the light-converging point P of laser light L positioned at the rear face of the object 1 in order for the light-converging point P of laser light L to be placed at a desirable position within the substrate in the object 1. This amount of movement is fed into the overall controller 127.

The object 1 is mounted on the mounting table 107 of the laser processing apparatus 100 such that the rear face of the substrate faces the light-converging lens 105. Subsequently, visible light is generated from the observation light source 117, so as to illuminate the rear face of the substrate of the object 1 (S105). The illuminated rear face including the line along which the object should be cut 5 is captured by the image pickup device 121. The line along which the object should be cut 5 is a desirable virtual line for cutting the object 1. The imaging data captured by the imaging device 121 is sent to the imaging data processor 125. According to the imaging data, the imaging data processor 125 calculates such focal point data that the focal point of visible light from the observation light source 117 is positioned at the rear face of the substrate of the object 1 (S107).

The focal point data is sent to the stage controller 115. According to the focal point data, the stage controller 115 moves the Z-axis stage 113 in the Z-axis direction (S109). As a consequence, the focal point of visible light from the observation light source 117 is positioned at the rear face of the substrate of the object 1. According to the imaging data, the imaging data processor 125 calculates enlarged image data of the rear face of the substrate of the object 1 including the line along which the object should be cut 5. The enlarged image data is sent to the monitor 129 by way of the overall controller 127, whereby an enlarged image of the line along which the object should be cut 5 and its vicinity is displayed on the monitor 129.

Movement amount data determined in step S103 has been fed into the overall controller 127 beforehand, and is sent to the stage controller 115. According to the movement amount data, the stage controller 115 causes the Z-axis stage 113 to move the object 1 in the Z-axis direction to a position where the light-converging point P of laser light L is positioned within the substrate of the object 1 (S111).

Subsequently, laser light L is generated from the laser light source 101, so as to irradiate the line along which the object should be cut 5 in the rear face of the substrate of the object 1. Since the light-converging point P of the laser light L is positioned within the substrate of the object 1, a modified region is formed only within the substrate of the object 1. Then, the X-axis stage 109 and Y-axis stage 111 are moved along the line along which the object should be cut 5, such that the modified region formed along the line along which the object should be cut 5 forms a starting point region for cutting within the object 1 along the line along which the object should be cut 5 (S113).

As explained in the foregoing, the laser processing method in accordance with this embodiment irradiates the object 1 with the laser light L from the rear face side of the substrate therein, whereby the modified region formed by multiphoton absorption within the substrate can form a starting point region for cutting along a desirable line along which the object should be cut 5 for cutting the object 1. In view of the thickness, material, etc. of the laminate part disposed on the substrate, the position of the modified region formed within the substrate is controlled by regulating the position where the light-converging point P of the laser light L is placed. Therefore, the object 1 constructed such that the laminate part is disposed on the front face of the substrate can be broken and cut with a relatively small force from the starting point region for cutting formed within the substrate as a start point.

The laminate part of the object 1 may be irradiated with laser light L having a wavelength to which the laminate part is transparent or exhibits a low absorption while the light-converging point P is positioned within the laminate part, such that a starting point region for cutting along the line along which the object should be cut 5 is also formed within the laminate part. In this case, the object 1 can be broken and cut with a smaller force.

Examples of the laser processing method in accordance with this embodiment will now be explained with reference to FIGS. 16 to 21.

Example 1

Figure 16A:
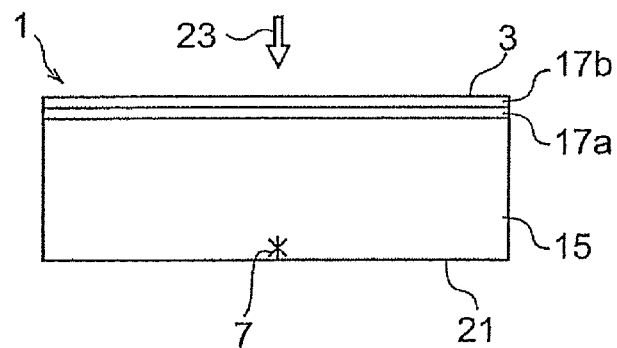
FIG. 16A is a view showing a case where a modified region is formed near the rear face of the substrate in the object to be processed in accordance with Example 1.
Figure 16B:
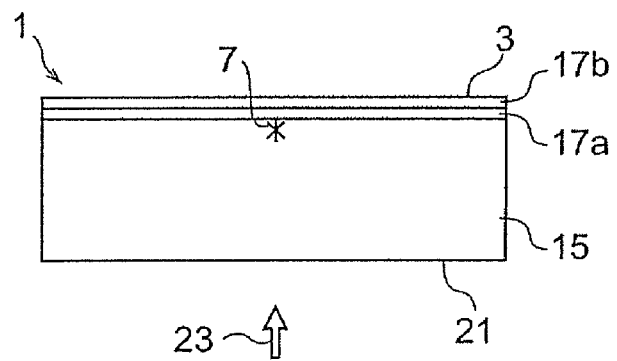
FIG. 16B is a view showing a case where a modified region is formed near the front face of the substrate in the object to be processed in accordance with Example 1.

FIG. 16A is a view showing a case where a modified region 7 is formed near the rear face of a substrate 15 in the object to be processed 1 in accordance with Example 1, whereas FIG. 16B is a view showing a case where a modified region 7 is formed near the front face of the substrate 15 in the object 1 in accordance with Example 1. Examples of the object 1 shown in FIGS. 16A and 16B include one used for next-generation high-speed/low-power-consumption devices and one for next-generation devices.

The substrate 15, first laminate part 17a, and second laminate part 17b for a next-generation high-speed/low-power-consumption device are Si (500 µm), $SiO_2$ (1 µm), and Si (3 µm), respectively. On the other hand, the substrate 15, first laminate part 17a, and second laminate part 17b for a next-generation device are Si(500 µm), $SrTiO_3$ (several hundred µm), and GaAs (several hundred µm), respectively (where values in parentheses indicate thickness).

When the modified region 7 is positioned near the rear face 21 of the object 1, a knife edge 23 is pressed against the front face 3 of the object 1 along a starting point region for cutting formed by the modified region 7 as shown in FIG. 16A, so as to break and cut the object 1. This is because a large tensile stress among bending stresses generated by pressing the knife edge 23 acts on the modified region 7, whereby the object can be cut with a relatively small force. When the modified region 7 is positioned near the front face 3 of the object 1, on the other hand, the knife edge 23 is pressed against the rear face 21 of the object 1 as shown in FIG. 16B because of the same reason, so as to break and cut the object 1.

Here, "the modified region 7 is positioned near the rear face 21 of the object 1" means that the modified region 7 constituting the starting point region for cutting is formed so as to shift from the center position of the object 1 in the thickness direction (half thickness position) toward the rear face 21. Namely, it refers to a case where the center position of the width of the modified region 7 in the thickness direction of the object 1 is shifted from the center position of the object 1 in the thickness direction toward the rear face 21, and is not limited to a case where the whole modified region 7 is positioned on the rear face 21 side from the center position of the object 1 in the thickness direction. Similarly, "the modified region 7 is positioned near the front face 3 of the object 1" means that the modified region 7 constituting the starting point region for cutting is formed so as to shift from the center position of the object 1 in the thickness direction (half thickness position) toward the front face 3. The foregoing also holds for the position where the modified region 7 is formed with respect to the substrate 15.

Example 2

Figure 17A:
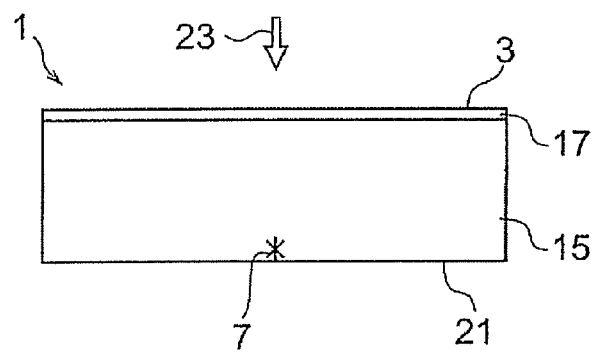
FIG. 17A is a view showing a case where a modified region is formed near the rear face of the substrate in the object to be processed in accordance with Example 2.
Figure 17B:
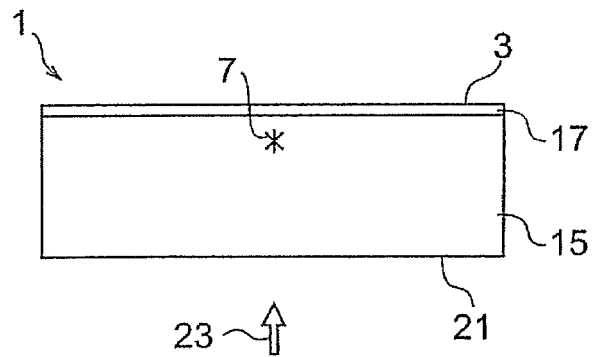
FIG. 17B is a view showing a case where a modified region is formed near the front face of the substrate in the object to be processed in accordance with Example 2.

FIG. 17A is a view showing a case where a modified region 7 is formed near the rear face of a substrate 15 in the object to be processed 1 in accordance with Example 2, whereas FIG. 17B is a view showing a case where a modified region 7 is formed near the front face of the substrate 15 in the object 1 in accordance with Example 2. The object 1 shown in FIGS. 17A and 17B is one for a blue LD/LED, examples of its substrate 15/laminate part 17 include $Al_2O_3$ (500 µm)/a laminated functional film (several hundred nm) in which a plurality of layers of semiconductor crystals such as GaN are formed, and $Al_2O_3$ (500 µm)/a laminated functional film (several hundred nm) in which a plurality of layers such as a ZnO layer are formed (where values in parentheses indicate thickness).

When the modified region 7 is positioned near the rear face 21 of the object 1, the knife edge 23 is pressed against the front face 3 of the object 1 as shown in FIG. 17A, so as to break and cut the object 1, because of the same reason as in the case of the object in accordance with Example 1. When the modified region 7 is positioned near the front face 3 of the object 1, on the other hand, the knife edge 23 is pressed against the rear face 21 of the object 1 as shown in FIG. 17B, so as to break and cut the object 1.

Example 3

Figure 18A:
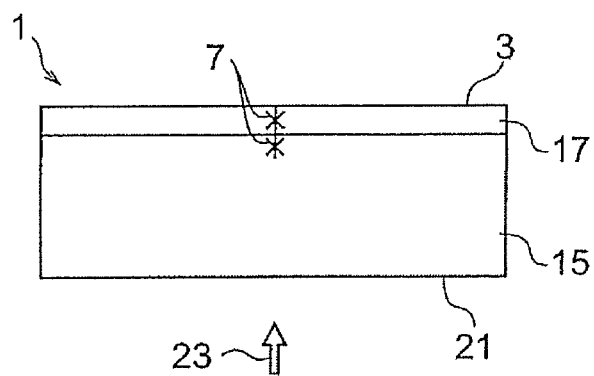
FIG. 18A is a view showing a case where modified regions are formed near the front face of the substrate and in the laminate part in the object to be processed in accordance with Example 3.
Figure 18B:
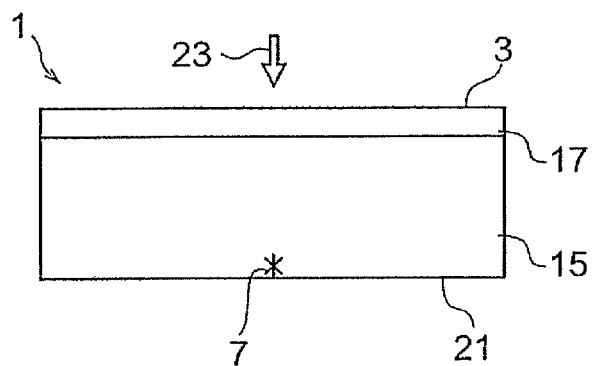
FIG. 18B is a view showing a case where a modified region is formed near the rear face of the substrate in the object to be processed in accordance with Example 3.
Figure 18C:
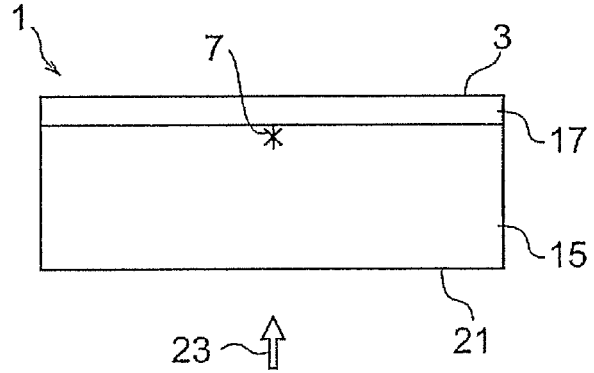
FIG. 18C is a view showing a case where a modified region is formed near the front face of the substrate in the object to be processed in accordance with Example 3.

FIG. 18A is a view showing a case where respective modified regions 7 are formed near the front face of a substrate 15 and in a laminate part 17 in the object to be processed 1 in accordance with Example 3; FIG. 18B is a case where a modified region 7 is formed near the rear face of the substrate 15 in the object 1 in accordance with Example 3; and FIG. 18C is a view showing a case where a modified region 7 is formed near the front face of the substrate 15 in the object 1 in accordance with Example 3. The object 1 shown in FIGS. 18A to 18C is one for an infrared light detecting device, examples of its substrate 15/laminate part 17 include $Al_2O_3$ (500 µm)/PbSe (10 µm), and $Al_2O_3$ (500 µm)/HgCdTe (10 µm) (where values in parentheses indicate thickness).

When the modified region 7 is positioned near the front face 3 of the object 1 as shown in FIGS. 18A and 18C, the knife edge 23 is pressed against the rear face 21 of the object 1, so as to break and cut the object 1, from the same reason as in the case of the object 1 in accordance with Example 1. When the modified region 7 is positioned near the rear face 21 of the object 1, on the other hand, the knife edge 23 is pressed against the front face 3 of the object 1 as shown in FIG. 18B, so as to break and cut the object 1.

Example 4

Figure 19:
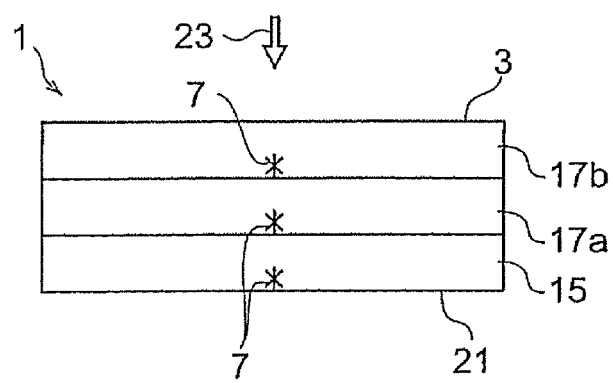
FIG. 19 is a view showing the object to be processed in accordance with Example 4.

FIG. 19 is a view showing the object to be processed 1 in accordance with Example 4. The object 1 shown in FIG. 19 is multilayer glass, in which two glass substrates as a first laminate part 17a and a second laminate part 17b are attached together and laminated on a glass substrate as a substrate 15. The modified region 7 in each glass substrate is formed on the rear face 21 side of the object 1. The knife edge 23 is pressed against the front face 3 of the object 1 in this case as well, so as to break and cut the object 1, because of the same reason as in the case of the object 1 in accordance with Example 1. In the case where the laminate part has a large thickness or high degree of hardness as such, the object 1 can be broken and cut with a smaller force if a starting point region for cutting is formed within the laminate part as well.

Example 5

Figure 20A:
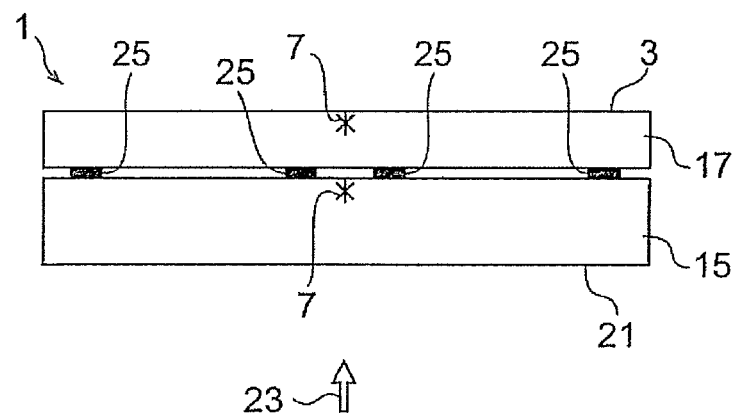
FIG. 20A is a view showing a case where respective modified regions are formed near the front face of the substrate and near the front face of the laminate part in the object to be processed in accordance with Example 5.
Figure 20B:
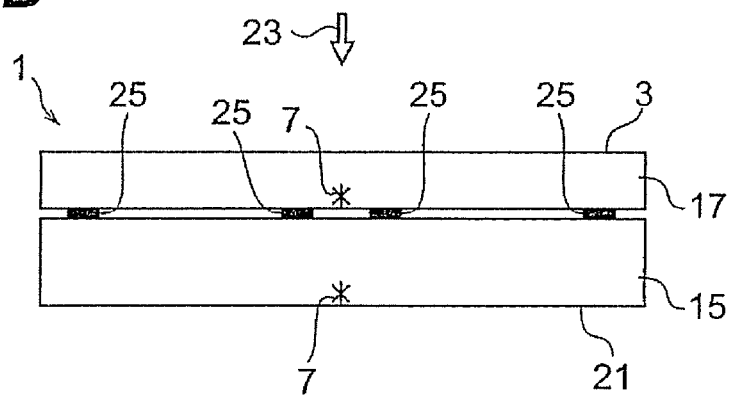
FIG. 20B is a view showing a case where respective modified regions are formed near the rear face of the substrate and near the rear face of the laminate part in the object to be processed in accordance with Example 5.
Figure 21A:
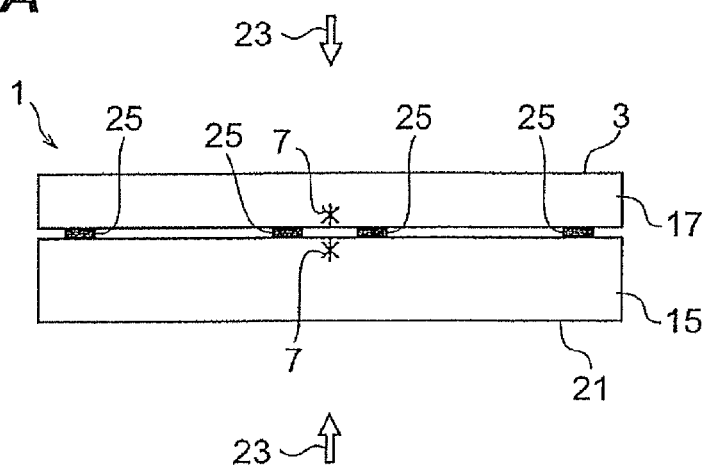
FIG. 21A is a view showing a case where respective modified regions are formed near the front face of the substrate and near the rear face of the laminate part in the object to be processed in accordance with Example 5.
Figure 21B:
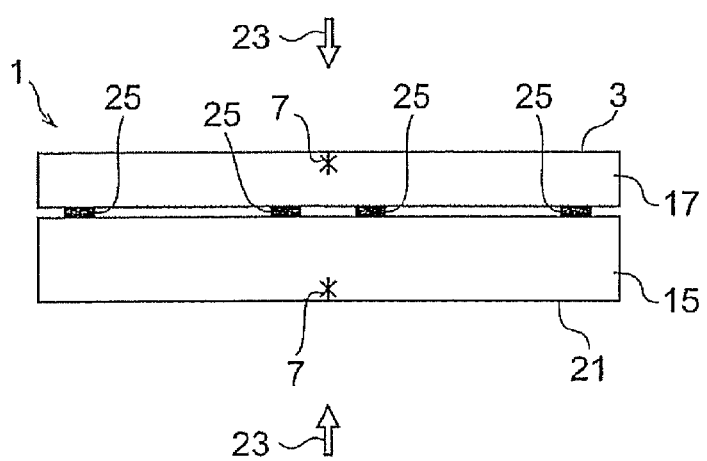
FIG. 21B is a view showing a case where respective modified regions are formed near the rear face of the substrate and near the front face of the laminate part in the object to be processed in accordance with Example 5.

FIGS. 20A to 21B are views showing the object to be processed 1 in accordance with Example 5. FIG. 20A is a view showing a case where respective modified regions 7 are formed near the front face of a substrate 15 and near the front face of a laminate part 17 in the object 1 in accordance with Example 5, whereas FIG. 20B is a view showing a case where respective regions 7 are formed near the rear face of the substrate 15 and near the rear face of the laminate part 17 in the object 1 in accordance with Example 5. FIG. 21A is a view showing a case where respective modified regions 7 are formed near the front face of the substrate 15 and near the rear face of the laminate part 17 in the object 1 in accordance with Example 5, whereas FIG. 21B is a view showing a case where respective regions 7 are formed near the rear face of the substrate 15 and near the front face of the laminate part 17 in the object 1 in accordance with Example 5.

The object 1 shown in FIGS. 20A to 21B is one for a reflection type liquid crystal display unit. The substrate 15 is a glass substrate (having a thickness of 1.8 mm and an outer diameter of 8 inches) formed with a common electrode, whereas the laminate part 17 is an Si substrate (having a thickness of 500 µm and an outer diameter of 8 inches) formed with TFT. The substrate 15 and laminate part 17 are bonded to each other with an adhesive 25 while forming a gap therebetween for receiving a liquid crystal.

In the case of FIGS. 20A and 20B, the object 1 is irradiated with laser light from the rear face 21 side, so as to form a modified region 7 within the laminate part 17, and then the object 1 is irradiated with the laser light from the rear face 21 side, so as to form a modified region 7 within the substrate 15. This is because the laser light has a wavelength to which both the substrate 15 and laminate part 17 are transparent or exhibit a low absorption. Because of the same reason as in the case of the object 1 in accordance with Example 1, the knife edge 23 is pressed against the rear face 21 of the object 1 in the case of FIG. 20A, so as to break and cut the object 1. In the case of FIG. 20B, on the other hand, the knife edge 23 is pressed against the front face 3 of the object 1, so as to break and cut the object 1.

When respective starting point regions for cutting are formed in the substrate 15 and laminate part 17 by using laser light having a wavelength to which both the substrate 15 and laminate part 17 are transparent or exhibit a low absorption, an operation of reversing the object 1 performed in a conventional diamond scribing method can be saved, whereby the object 1 can be prevented from being broken and so forth at the time of reversing operation. This can also prevent positional deviations from occurring between the respective starting point regions for cutting formed in the substrate 15 and laminate part 17, whereby the object 1 can be cut with a high accuracy. Further, lubricating/washing water which is required in the conventional blade dicing is unnecessary, whereby there is no problem of the lubricating/washing water entering the gap between the substrate 15 and laminate part 17.

In the case of FIGS. 21A and 21B, the object 1 is irradiated with laser light from the rear face 21 side, so as to form a modified region 7 within the substrate 15, and then is irradiated with the laser light from the front face 3 side, so as to form a modified region 7 within the laminate part 17. In the case of FIG. 21A, because of the same reason as in the case of the object 1 in accordance with Example 1, the knife edge 23 is initially pressed against the rear face 21 of the object 1, so as to break and cut the substrate 15, and then the knife edge 23 is pressed against the front face 3 of the object 1, so as to break and cut the laminate part 17. In the case of FIG. 21B, on the other hand, the knife edge 23 is initially pressed against the front face 3 of the object 1, so as to break and cut the substrate 15, and then the knife edge 23 is pressed against the rear face 21 of the object 1, so as to break and cut the laminate part 17.

Example 6

Figure 22:
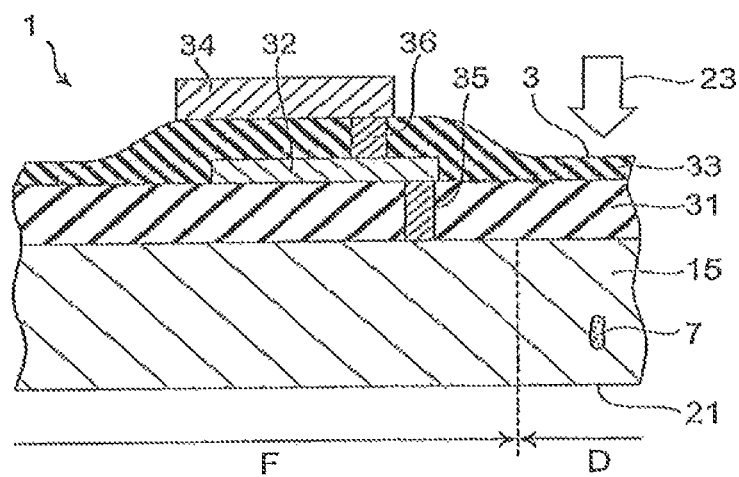
FIG. 22 is an enlarged view showing a major part of the object to be processed in accordance with Example 6.

FIG. 22 is an enlarged sectional view showing a major part of the object to be processed 1 in accordance with Example 6. This object 1 is one in which a number of chip forming regions F are disposed on a substrate 15 which is a silicon wafer, whereas a dicing line region D is formed between the chip forming regions F, F adjacent each other. FIG. 22 shows a cross section of a part where the chip forming region F and the dicing line region D are continuous with each other. A line along which the object should be cut is set along the dicing line region D.

As shown in this drawing, an interlayer insulating film (laminate part) 31 is formed on the substrate 15, whereas a metal wiring layer 32 is disposed on the interlayer insulating film 31 at the chip forming region F in the substrate 15. Further, an interlayer insulating film (laminate part) 33 is formed so as to cover the interlayer insulating film 31 and metal wiring layer 32 on the substrate 15, whereas a metal wiring layer 34 is formed on the interlayer insulating film 33 in the chip forming region F of the substrate 15. The substrate 15 and the metal wiring layer 32 are electrically connected to each other with a plug 35 penetrating through the interlayer insulating film 31. The metal wiring layers 32 and 34 are electrically connected to each other with a plug 36 penetrating through the interlayer insulating film 33.

Thus configured object 1 is irradiated with laser light while a light-converging point is positioned within the substrate 15, so as to form a modified region 7 within the substrate 15 along the dicing line region D (i.e., along the line along which the object should be cut), and cause the modified region 7 to form a starting point region for cutting. Then, the object 1 can be cut with a high accuracy when the knife edge 23 is pressed against the front face 3 or rear face 21 of the object 1 along the starting point region for cutting.

The object 1 can be cut with a high accuracy even when the insulating films 31, 32 made of $SiO_2$, SiN, or the like are formed as laminate parts on the line along which the object should be cut in the substrate 15 as with the object 1 in accordance with Example 6 in the foregoing.

Though the embodiment of the present invention is explained in detail in the foregoing, the present invention is not limited to the above-mentioned embodiment as a matter of course.

Though the above-mentioned embodiment relates to a case where an object to be processed comprising a substrate and a laminate part disposed on the front face of the substrate is irradiated with laser light, so as to form a starting point region for cutting, a substrate may initially be irradiated with laser light, so as to form a starting point region for cutting, and then the front face of the substrate may be provided with a laminate part, so as to form an object to be processed in the present invention.

Though the starting point region for cutting is formed within the substrate before providing the surface of the substrate with a laminate part in this laser processing method, the modified region is formed only locally by multiphoton absorption, so that the laser light is hardly absorbed by the front face of the substrate, whereby the front face of the substrate does not melt. Therefore, as in the case where no modified region is formed within the substrate, the front face of the substrate can be provided with the laminate part, so as to form the object to be processed. Because of the same reason as in the above-mentioned embodiment, thus formed object to be processed can be broken and cut with a relatively small force from the starting point region for cutting formed within the substrate as a start point.

INDUSTRIAL APPLICABILITY

In the laser processing method in accordance with the present invention, as explained in the foregoing, a modified region formed by a phenomenon of multiphoton absorption can form a cut start area within a substrate of an object to be processed along a desirable line along which the object should be cut for cutting the object. Also, in view of the thickness, material, etc. of the laminate part disposed on the front face of the substrate, the distance from the front face of the substrate to the modified region in the starting point region for cutting can be controlled by regulating the position where the light-converging point of the laser light is positioned. Therefore, the object configured such that the laminate part is disposed on the front face of the substrate can be broken and cut with a relatively small force from the starting point region for cutting, formed within the substrate, acting as a start point. The laminate part may also be irradiated with laser light while the light-converging point is positioned therewithin. In this case, the object can be broken and cut with a smaller force. Because of the foregoing, objects to be processed having various laminate structures can be cut with a high accuracy.

The invention claimed is:
1. A laser processing method comprising the steps of:
irradiating an object to be processed comprising a substrate and a laminate part disposed on a front face of the substrate with laser light while positioning a light-converging point at least within the substrate, thereby forming a modified region embedded within the substrate along each line of a plurality of cutting lines arranged in a grid with respect to the substrate, each substrate modified region forming a starting point region for cutting the object inside the object at a predetermined distance from a laser light incident face of the object; and
after completion of forming the substrate modified regions, applying a stress to the object which causes cutting of the substrate and the laminate part along the cutting lines thereby generating a fracture in a thickness direction of the substrate from each starting point region that reaches a front face of the laminate part and a rear face of the substrate, wherein after the irradiation of the laser light is performed, each substrate modified region exists only within the substrate, and wherein the at least one of the front and back face of the substrate is a surface of the substrate into which the laser light enters.

2. The laser processing method according to claim 1, wherein the modified region is formed due to multiphoton absorption.

3. The laser processing method according to claim 1, wherein the object is irradiated with the laser light while positioning the light-converging point at least within the substrate under a condition with a peak power density of at least $1 \times 10^8$ (W/cm$^2$) at the light-converging point and a pulse width of 1 µs or less and the modified region includes a crack region.

4. The laser processing method according to claim 1, wherein the object is irradiated with the laser light while positioning the light-converging point at least within the substrate under a condition with a peak power density of at least $1 \times 10^8$ (W/cm$^2$) at the light-converging point and a pulse width of 1 us or less, and the modified region includes a molten processed region.

5. The laser processing method according to claim 1, wherein the object is irradiated with the laser light while positioning the light-converging point at least within the substrate under a condition with a peak power density of at least $1 \times 10^8$ (W/cm$^2$) at the light-converging point and a pulse width of 1 ns or less, and the modified region includes a refractive index change region which is a region with a changed refractive index.

6. The laser processing method according to claim 1, wherein the object is irradiated with the laser light while positioning light-converging point at least with the substrate under a condition with a peak power density of at least $1 \times 10^8$ (W/cm$^2$) at the light-converging point and a pulse width of 1 µs or less.

7. The laser processing method according to claim 1, wherein the substrate is made of piezoelectric material and the object is irradiated with the laser light while positioning the light-converging point at least within the substrate under a condition with a peak power density of at least $1 \times 10^8$ (W/cm$^2$) at the light-converging point and a pulse width of 1 µs or less.

8. The laser processing method according to claim 1, wherein the substrate is made of a semiconductor material and the modified region includes a molten processed region.

9. A laser processing method comprising the steps of:

irradiating an object to be processed comprising a substrate and a laminate part disposed on a front face of the substrate with laser light while positioning a light-converging point within the substrate, irradiating the object with laser light while positioning a light-converging point within the laminate part, thereby forming a modified region embedded within the substrate and a laminate part modified region embedded within the laminate part along each line of a plurality of cutting lines, each of the substrate modified regions and the laminate part modified regions forming a starting point region for cutting the object inside the object at a predetermined distance from a laser light incident face of the object; and cutting the substrate and the laminate part along the cutting lines when a fracture generated in a thickness direction of the substrate from each starting point region reaches a front face of the laminate part and a rear face of the substrate;

wherein the substrate modified regions formed embedded within the substrate and the laminate part modified regions formed embedded within the laminate part are separate from each other, wherein after the irradiation of the laser light is performed, each substrate modified region exists only within the substrate, and wherein the at least one of the front and back face of the substrate is a surface of the substrate into which the laser light enters.

10. A laser processing method comprising the steps of:

irradiating a substrate with laser light while positioning a light-converging point within the substrate, thereby forming a modified region only within the substrate along each line of a plurality of cutting lines, each modified region forming a starting point region for cutting the substrate inside the substrate at a predetermined distance from a laser light incident face of the substrate; and providing a laminate part on a front face of the substrate after forming the starting point regions; and cutting the substrate and the laminate part along the cutting lines when a fracture generated in a thickness direction of the substrate from each starting point region reaches a front face of the laminate part and a rear face of the substrate, wherein after the irradiation of the laser light is performed, each substrate modified region exists only within the substrate, and wherein the at least one of the front and back face of the substrate is a surface of the substrate into which the laser light enters.

11. A method of manufacturing a semiconductor device formed using a laser processing method, the manufacturing method comprising:

irradiating an object to be processed comprising a substrate and a laminate part disposed on a front face of the substrate, the substrate and the laminate part having at least one semiconductor device, with laser light while positioning a light-converging point at least within the substrate, thereby forming a modified region embedded within the substrate along each line of a plurality of cutting lines arranged in a grid with respect to the substrate, each substrate modified region forming a starting point region for cutting the object, each substrate modified region being located inside the object at a predetermined distance from a laser light incident face of the object; and after completion of forming the substrate modified regions, applying a stress to the object causing cutting of the substrate and the laminate part along the cutting lines thereby generating a fracture in a thickness direction of the substrate from each starting point region that reaches a front face of the laminate part and a rear face of the substrate, wherein completion of the cutting step results in provision of at least one manufactured semiconductor device, wherein after the irradiation of the laser light is performed, each substrate modified region exists only within the substrate, and wherein the at least one of the front and back face of the substrate is a surface of the substrate into which the laser light enters.

12. The laser processing method according to claim 11, wherein the modified region is formed due to multiphoton absorption.

13. The laser processing method according to claim 11, wherein the object is irradiated with the laser light while positioning a light-converging point at least within the substrate under a condition with a peak power density of at least $1\times10^8$ (W/cm$^2$) at the light-converging point and a pulse width of 1 µs or less, and the modified region includes a molten processed region.

14. The laser processing method according to claim 11, wherein the object is irradiated with the laser light while positioning a light-converging point at least within the substrate under a condition with a peak power density of at least $1\times10^8$ (W/cm$^2$) at the light-converging point and a pulse width of 1 ns or less.

15. The laser processing method according to claim 11, wherein the modified region includes a molten processed region.

16. The method according to claim 15, wherein the object is irradiated with laser light while positioning a light-converging point at least with the substrate under a condition with a peak power density of at least $1\times10^8$ (W/cm$^2$) at the light-converging point and a pulse width of 1 us or less.

17. A method of manufacturing a semiconductor device formed using a laser processing method, the manufacturing method comprising:
   irradiating an object to be processed comprising a substrate and a laminate part disposed on a front face of the substrate, the substrate and the laminate part having at least one semiconductor device, with laser light while positioning a light-converging point within the substrate, irradiating the object with laser light while positioning a light-converging point within the laminate part, thereby forming a modified region embedded within the substrate and a laminate part modified region embedded within the laminate part along each line of a plurality of cutting lines, each of the substrate modified region and the laminate part modified region forming a starting point region for cutting the object located inside the object at a predetermined distance from a laser light incident face of the object; and
   cutting the substrate and the laminate part along the cutting lines when a fracture generated in a thickness direction of the substrate from each starting point region reaches a front face of the laminate part and a rear face of the substrate, wherein completion of the cutting step results in provision of at least one manufactured semiconductor device;
   wherein the substrate modified regions formed embedded within the substrate and the laminate part modified regions formed embedded within the laminate part are separate from each other,
   wherein after the irradiation of the laser light is performed, each substrate modified region exists only within the substrate, and
   wherein the at least one of the front and back face of the substrate is a surface of the substrate into which the laser light enters.

18. A method of manufacturing a semiconductor device formed using a laser processing method, the manufacturing method comprising:
   irradiating a substrate with laser light while positioning a light-converging point within the substrate, thereby forming a substrate modified region only within the substrate along each line of a plurality of cutting lines, each modified region forming a starting point region for cutting the substrate, each modified region being located only inside the substrate at a predetermined distance from a laser light incident face of the substrate;
   providing a laminate part on a front face of the substrate after forming the starting point regions; and
   cutting the substrate and the laminate part along the cutting lines when a fracture generated in a thickness direction of the substrate from each starting point region reaches a front face of the laminate part and a rear face of the substrate, wherein completion of the cutting step results in provision of at least one manufactured semiconductor device,
   wherein after the irradiation of the laser light is performed, each substrate modified region exists only within the substrate, and
   wherein the at least one of the front and back face of the substrate is a surface of the substrate into which the laser light enters.

* * * * *

UNITED STATES PATENT AND TRADEMARK OFFICE
CERTIFICATE OF CORRECTION

PATENT NO.        : 8,598,015 B2  
APPLICATION NO.   : 13/614042  
DATED             : December 3, 2013  
INVENTOR(S)       : Fumitsugu Fukuyo et al.

Page 1 of 1

It is certified that error appears in the above-identified patent and that said Letters Patent is hereby corrected as shown below:

ON THE TITLE PAGE:

Item (73) Assignee:

"Hamanatsu-shi, Shizuoka (JP)" should read --Hamamatsu-shi, Shizuoka (JP)--.

Signed and Sealed this  
First Day of April, 2014

Michelle K. Lee  
*Deputy Director of the United States Patent and Trademark Office*